United States Patent
Ahn et al.

(10) Patent No.: US 7,160,577 B2
(45) Date of Patent: Jan. 9, 2007

(54) METHODS FOR ATOMIC-LAYER DEPOSITION OF ALUMINUM OXIDES IN INTEGRATED CIRCUITS

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/137,168

(22) Filed: May 2, 2002

(65) Prior Publication Data

US 2003/0207032 A1 Nov. 6, 2003

(51) Int. Cl.
*C23C 16/40* (2006.01)

(52) U.S. Cl. .................. 427/255.31; 427/99; 427/376.2

(58) Field of Classification Search ................ 427/250, 427/255.31, 376.1, 99, 376.2
See application file for complete search history.

(56) References Cited

U.S. PATENT DOCUMENTS

| | | | |
|---|---|---|---|
| 3,357,961 A | 12/1967 | Makowski et al. | |
| 3,381,114 A | 4/1968 | Nakanuma | |
| 3,407,479 A | 10/1968 | Fordemwalt et al. | |
| 3,457,123 A | 7/1969 | Van Pul | |
| 3,471,754 A | 10/1969 | Hoshi et al. | |
| 3,689,357 A | 9/1972 | Jordan | |
| 4,051,354 A | 9/1977 | Choate | |
| 4,058,430 A | 11/1977 | Suntola et al. | |
| 4,209,357 A | * 6/1980 | Gorin et al. | |
| 4,215,156 A | 7/1980 | Dalal et al. | |
| 4,292,093 A | 9/1981 | Ownby et al. | |
| 4,305,640 A | 12/1981 | Cullis et al. | |
| 4,333,808 A | 6/1982 | Bhattacharyya et al. | |
| 4,399,424 A | 8/1983 | Rigby | |

(Continued)

FOREIGN PATENT DOCUMENTS

| | | |
|---|---|---|
| EP | 0540993 A1 | 5/1993 |
| EP | 1324376 A1 | 7/2003 |
| JP | 62-199019 | 9/1987 |
| JP | 5090169 | 4/1993 |
| JP | 07-320996 | 12/1995 |
| JP | 09-293845 | 11/1997 |
| JP | 11-335849 | 12/1999 |
| JP | 2000-192241 | 7/2000 |
| JP | 2001-332546 | 11/2001 |
| WO | WO-0233729 A2 | 4/2002 |
| WO | WO-2004/079796 A3 | 9/2004 |

OTHER PUBLICATIONS

Ahn, Kie Y., "Cobalt Titanium Oxide Dielectric Films", U.S. Appl. No. 11/216,958, filed Aug. 31, 2005.*

Ahn, Kie Y., "Gallium Lanthanide Oxide Films (working title)", (U.S. Appl. No. 11/329,025, filed Jan. 10, 2006.*

(Continued)

*Primary Examiner*—Bret Chen
(74) *Attorney, Agent, or Firm*—Schwegman, Lundberg, Woessner & Kluth, P.A.

(57) ABSTRACT

The present inventors devised unique atomic-layer deposition systems, methods, and apparatus suitable for aluminum-oxide deposition. One exemplary method entails providing an outer chamber enclosing a substrate, forming an inner chamber within the outer chamber, and introducing an oxidant into the inner chamber, and introducing an aluminum precursor into the inner chamber. The inner chamber has a smaller volume than the outer chamber, which ultimately requires less time to fill and purge and thus promises to reduce cycle times for deposition of materials, such as aluminum oxide.

19 Claims, 3 Drawing Sheets

U.S. PATENT DOCUMENTS

| | | |
|---|---|---|
| 4,413,022 A | 11/1983 | Suntola et al. |
| 4,590,042 A | 5/1986 | Drage |
| 4,604,162 A | 8/1986 | Sobczak |
| 4,647,947 A | 3/1987 | Takeoka et al. |
| 4,663,831 A | 5/1987 | Birrittella et al. |
| 4,673,962 A | 6/1987 | Chatterjee et al. |
| 4,761,768 A | 8/1988 | Turner et al. |
| 4,766,569 A | 8/1988 | Turner et al. |
| 4,767,641 A | 8/1988 | Kieser et al. |
| 4,894,801 A | 1/1990 | Saito et al. |
| 4,902,533 A * | 2/1990 | White et al. ................ 438/675 |
| 4,920,071 A | 4/1990 | Thomas |
| 4,920,396 A | 4/1990 | Shinohara et al. |
| 4,948,937 A | 8/1990 | Blank et al. |
| 4,962,879 A | 10/1990 | Goesele et al. |
| 4,987,089 A | 1/1991 | Roberts |
| 4,993,358 A | 2/1991 | Mahawili |
| 5,001,526 A | 3/1991 | Gotou |
| 5,006,192 A | 4/1991 | Deguchi |
| 5,017,504 A | 5/1991 | Nishimura et al. |
| 5,021,355 A | 6/1991 | Dhong et al. |
| 5,028,977 A | 7/1991 | Kenneth et al. |
| 5,032,545 A | 7/1991 | Doan et al. |
| 5,080,928 A | 1/1992 | Klinedinst et al. ............ 427/70 |
| 5,089,084 A | 2/1992 | Chhabra et al. |
| 5,097,291 A | 3/1992 | Suzuki |
| 5,102,817 A | 4/1992 | Chatterjee et al. |
| 5,110,752 A | 5/1992 | Lu |
| 5,122,856 A | 6/1992 | Komiya |
| 5,156,987 A | 10/1992 | Sandhu et al. |
| 5,177,028 A | 1/1993 | Manning |
| 5,198,029 A | 3/1993 | Dutta et al. ................. 118/303 |
| 5,202,278 A | 4/1993 | Mathews et al. |
| 5,208,657 A | 5/1993 | Chatterjee et al. |
| 5,223,081 A | 6/1993 | Doan |
| 5,234,535 A | 8/1993 | Beyer et al. |
| 5,266,514 A | 11/1993 | Tuan et al. |
| 5,302,461 A | 4/1994 | Anthony |
| 5,320,880 A | 6/1994 | Sandhu et al. |
| 5,324,980 A | 6/1994 | Kusunoki |
| 5,327,380 A | 7/1994 | Kersh, III et al. |
| 5,376,575 A | 12/1994 | Kim et al. |
| 5,391,911 A | 2/1995 | Beyer et al. |
| 5,392,245 A | 2/1995 | Manning |
| 5,393,704 A | 2/1995 | Huang et al. |
| 5,396,093 A | 3/1995 | Lu |
| 5,410,169 A | 4/1995 | Yamamoto et al. |
| 5,414,287 A | 5/1995 | Hong |
| 5,414,288 A | 5/1995 | Fitch et al. |
| 5,416,041 A | 5/1995 | Schwalke |
| 5,421,953 A | 6/1995 | Nagakubo et al. |
| 5,422,499 A | 6/1995 | Manning |
| 5,438,009 A | 8/1995 | Yang et al. |
| 5,440,158 A | 8/1995 | Sung-Mu |
| 5,441,591 A | 8/1995 | Imthurn et al. |
| 5,445,986 A | 8/1995 | Hirota |
| 5,455,445 A | 10/1995 | Kurtz et al. |
| 5,460,316 A | 10/1995 | Hefele |
| 5,460,988 A | 10/1995 | Hong |
| 5,466,625 A | 11/1995 | Hsieh et al. |
| 5,483,094 A | 1/1996 | Sharma et al. |
| 5,483,487 A | 1/1996 | Sung-Mu |
| 5,492,853 A | 2/1996 | Jeng et al. |
| 5,495,441 A | 2/1996 | Hong |
| 5,497,017 A | 3/1996 | Gonzales |
| 5,504,357 A | 4/1996 | Kim et al. |
| 5,504,376 A | 4/1996 | Sugahara et al. |
| 5,508,219 A | 4/1996 | Bronner et al. |
| 5,508,542 A | 4/1996 | Geiss et al. |
| 5,522,932 A | 6/1996 | Wong et al. |
| 5,528,062 A | 6/1996 | Hsieh et al. |
| 5,562,952 A | 10/1996 | Nakahigashi et al. |
| 5,572,052 A | 11/1996 | Kashihara et al. |
| 5,593,912 A | 1/1997 | Rajeevakumar |
| 5,595,606 A | 1/1997 | Fujikawa et al. |
| 5,614,026 A | 3/1997 | Williams |
| 5,616,934 A | 4/1997 | Dennison et al. |
| 5,625,233 A | 4/1997 | Cabral, Jr. et al. |
| 5,640,342 A | 6/1997 | Gonzalez |
| 5,644,540 A | 7/1997 | Manning |
| 5,646,900 A | 7/1997 | Tsukude et al. |
| 5,674,563 A | 10/1997 | Tarui et al. |
| 5,674,574 A | 10/1997 | Atwell et al. |
| 5,691,230 A | 11/1997 | Forbes |
| 5,698,022 A | 12/1997 | Glassman et al. |
| 5,710,057 A | 1/1998 | Kenney |
| 5,735,960 A | 4/1998 | Sandhu et al. |
| 5,745,334 A | 4/1998 | Hoffarth et al. |
| 5,756,404 A | 5/1998 | Friedenreich et al. |
| 5,795,808 A | 8/1998 | Park |
| 5,801,105 A | 9/1998 | Yano et al. |
| 5,810,923 A | 9/1998 | Yano et al. |
| 5,822,256 A | 10/1998 | Bauer et al. |
| 5,827,571 A | 10/1998 | Lee et al. |
| 5,828,080 A | 10/1998 | Yano et al. |
| 5,840,897 A | 11/1998 | Kirlin et al. |
| 5,892,249 A | 4/1999 | Courtright et al. |
| 5,912,797 A | 6/1999 | Schneemeyer et al. |
| 5,916,365 A | 6/1999 | Sherman ...................... 117/92 |
| 5,950,925 A | 9/1999 | Fukunaga et al. |
| 5,963,833 A | 10/1999 | Thakur |
| 5,994,240 A | 11/1999 | Thakur |
| 6,013,553 A | 1/2000 | Wallace et al. |
| 6,017,820 A * | 1/2000 | Ting et al. |
| 6,020,024 A | 2/2000 | Maiti et al. |
| 6,027,960 A | 2/2000 | Kusumoto et al. |
| 6,027,961 A | 2/2000 | Maiti et al. |
| 6,040,243 A | 3/2000 | Li et al. |
| 6,057,271 A | 5/2000 | Kenjiro et al. |
| 6,059,885 A | 5/2000 | Ohashi et al. |
| 6,093,623 A | 7/2000 | Forbes |
| 6,093,944 A | 7/2000 | VanDover |
| 6,110,529 A | 8/2000 | Gardiner et al. |
| 6,114,252 A | 9/2000 | Donohoe et al. |
| 6,127,287 A | 11/2000 | Hurley et al. |
| 6,143,582 A | 11/2000 | Vu et al. |
| 6,161,500 A | 12/2000 | Kopacz et al. |
| 6,165,837 A | 12/2000 | Kawakubo et al. |
| 6,171,900 B1 | 1/2001 | Sun |
| 6,184,146 B1 | 2/2001 | Donohoe et al. |
| 6,194,262 B1 | 2/2001 | Noble |
| 6,203,613 B1 | 3/2001 | Gates et al. |
| 6,206,972 B1 | 3/2001 | Dunham |
| 6,211,035 B1 | 4/2001 | Moise et al. |
| 6,211,039 B1 | 4/2001 | Noble |
| 6,218,293 B1 | 4/2001 | Kraus et al. |
| 6,225,168 B1 | 5/2001 | Gardner et al. |
| 6,274,479 B1 | 8/2001 | Srinivasan |
| 6,281,144 B1 | 8/2001 | Cleary et al. |
| 6,290,491 B1 | 9/2001 | Shahvandi et al. |
| 6,291,314 B1 | 9/2001 | Henley et al. |
| 6,297,539 B1 | 10/2001 | Ma et al. |
| 6,300,203 B1 | 10/2001 | Buynoski et al. |
| 6,300,255 B1 | 10/2001 | Venkataranan et al. |
| 6,302,964 B1 | 10/2001 | Umotoy et al. |
| 6,303,481 B1 | 10/2001 | Park |
| 6,303,500 B1 | 10/2001 | Jiang et al. |
| 6,313,035 B1 | 11/2001 | Sandhu et al. |
| 6,317,175 B1 | 11/2001 | Salerno et al. |
| 6,342,445 B1 | 1/2002 | Marsh |
| 6,348,386 B1 | 2/2002 | Gilmer |

| Patent No. | Date | Inventor |
|---|---|---|
| 6,365,519 B1 | 4/2002 | Kraus et al. |
| 6,368,941 B1 | 4/2002 | Chen et al. |
| 6,380,579 B1 | 4/2002 | Nam et al. |
| 6,387,712 B1 | 5/2002 | Yano et al. |
| 6,391,769 B1 | 5/2002 | Lee et al. |
| 6,420,230 B1 | 7/2002 | Derderian et al. |
| 6,420,279 B1 | 7/2002 | Ono et al. |
| 6,432,779 B1 | 8/2002 | Hobbs et al. |
| 6,436,203 B1 | 8/2002 | Kaizuka et al. |
| 6,444,039 B1 | 9/2002 | Nguyen |
| 6,444,042 B1 | 9/2002 | Yang et al. |
| 6,444,895 B1 | 9/2002 | Nikawa ..................... 136/212 |
| 6,445,023 B1 | 9/2002 | Vaartstra et al. |
| 6,448,192 B1 | 9/2002 | Kaushik |
| 6,451,641 B1 | 9/2002 | Halliyal et al. |
| 6,451,662 B1 | 9/2002 | Chudzik et al. |
| 6,451,695 B1 | 9/2002 | Sneh |
| 6,454,912 B1 | 9/2002 | Ahn et al. |
| 6,458,701 B1 | 10/2002 | Chae et al. |
| 6,461,436 B1 | 10/2002 | Campbell et al. |
| 6,461,914 B1 | 10/2002 | Roberts et al. |
| 6,461,970 B1 | 10/2002 | Yin |
| 6,465,334 B1 | 10/2002 | Buynoski et al. |
| 6,472,321 B1 | 10/2002 | Srinivasan et al. |
| 6,482,740 B1 | 11/2002 | Soininen et al. |
| 6,495,436 B1 | 12/2002 | Ahn et al. |
| 6,506,666 B1 | 1/2003 | Marsh |
| 6,514,348 B1 | 2/2003 | Miyamoto |
| 6,514,828 B1 | 2/2003 | Ahn et al. |
| 6,518,634 B1 | 2/2003 | Nguyen et al. |
| 6,521,911 B1 | 2/2003 | Parsons et al. |
| 6,531,354 B1 | 3/2003 | Maria et al. |
| 6,533,867 B1 | 3/2003 | Doppelhammer |
| 6,534,357 B1 | 3/2003 | Basceri et al. |
| 6,534,420 B1 | 3/2003 | Ahn et al. |
| 6,537,613 B1 | 3/2003 | Senzaki et al. |
| 6,541,353 B1 | 4/2003 | Sandhu et al. |
| 6,544,875 B1 | 4/2003 | Wilk |
| 6,551,893 B1 | 4/2003 | Zheng et al. |
| 6,551,929 B1 | 4/2003 | Kori et al. |
| 6,559,472 B1 | 5/2003 | Sandhu et al. |
| 6,586,349 B1 | 7/2003 | Jeon et al. |
| 6,592,661 B1 | 7/2003 | Thakur et al. |
| 6,592,942 B1 | 7/2003 | Van Wijck |
| 6,596,583 B1 | 7/2003 | Agarwal et al. |
| 6,596,636 B1 | 7/2003 | Sandhu et al. |
| 6,602,338 B1 | 8/2003 | Chen et al. |
| 6,613,656 B1 | 9/2003 | Li |
| 6,617,634 B1 | 9/2003 | Marsh et al. |
| 6,620,670 B1 | 9/2003 | Song et al. |
| 6,627,260 B1 | 9/2003 | Derderian et al. |
| 6,627,503 B1 | 9/2003 | Ma et al. |
| 6,632,279 B1 | 10/2003 | Ritala et al. |
| 6,638,859 B1 | 10/2003 | Sneh et al. |
| 6,642,567 B1 | 11/2003 | Marsh |
| 6,642,573 B1 | 11/2003 | Halliyal et al. |
| 6,652,924 B1 | 11/2003 | Sherman |
| 6,656,371 B1 | 12/2003 | Drewes |
| 6,656,835 B1 | 12/2003 | Marsh et al. |
| 6,660,660 B1 | 12/2003 | Haukka et al. |
| 6,670,284 B1 | 12/2003 | Yin |
| 6,673,701 B1 | 1/2004 | Marsh et al. |
| 6,674,138 B1 | 1/2004 | Halliyal et al. |
| 6,677,250 B1 | 1/2004 | Campbell et al. |
| 6,683,011 B1 | 1/2004 | Smith et al. |
| 6,686,212 B1 | 2/2004 | Conley, Jr. et al. |
| 6,696,332 B1 | 2/2004 | Visokay et al. |
| 6,699,745 B1 | 3/2004 | Banerjee et al. |
| 6,699,747 B1 | 3/2004 | Ruff et al. |
| 6,709,989 B1 | 3/2004 | Ramdani et al. |
| 6,713,846 B1 | 3/2004 | Senzaki |
| 6,740,605 B1 | 5/2004 | Shiraiwa et al. |
| 6,750,066 B1 | 6/2004 | Cheung et al. |
| 6,762,114 B1 | 7/2004 | Chambers |
| 6,767,795 B1 | 7/2004 | Ahn et al. |
| 6,770,536 B1 | 8/2004 | Wilk et al. |
| 6,777,353 B1 | 8/2004 | Putkonen |
| 6,780,704 B1 | 8/2004 | Raaijmakers et al. |
| 6,787,413 B1 | 9/2004 | Ahn et al. |
| 6,794,315 B1 | 9/2004 | Klemperer et al. |
| 6,800,567 B1 | 10/2004 | Cho |
| 6,803,311 B1 | 10/2004 | Choi |
| 6,808,978 B1 | 10/2004 | Kim |
| 6,812,100 B1 | 11/2004 | Ahn et al. |
| 6,821,862 B1 | 11/2004 | Cho |
| 6,821,873 B1 | 11/2004 | Visokay et al. |
| 6,828,632 B1 | 12/2004 | Bhattacharyya |
| 6,831,315 B1 | 12/2004 | Raaijmakers et al. |
| 6,844,203 B1 | 1/2005 | Ahn et al. |
| 6,844,260 B1 | 1/2005 | Sarigiannis et al. |
| 6,852,167 B1 * | 2/2005 | Ahn ......................... 118/715 |
| 6,884,739 B1 | 4/2005 | Ahn et al. |
| 7,026,694 B1 | 4/2006 | Ahn et al. |
| 7,045,430 B1 * | 5/2006 | Ahn et al. |
| 7,049,192 B1 * | 5/2006 | Ahn et al. |
| 2001/0002280 A1 | 5/2001 | Sneh |
| 2001/0002582 A1 | 6/2001 | Dunham |
| 2001/0009383 A1 | 7/2001 | Nakayama et al. |
| 2001/0009695 A1 | 7/2001 | Saanila et al. |
| 2001/0010957 A1 | 8/2001 | Forbes et al. |
| 2001/0030352 A1 | 10/2001 | Ruff et al. |
| 2002/0001971 A1 | 1/2002 | Cho |
| 2002/0024080 A1 | 2/2002 | Derderian et al. |
| 2002/0025628 A1 | 2/2002 | Derderian et al. |
| 2002/0046705 A1 | 4/2002 | Sandhu et al. |
| 2002/0068466 A1 | 6/2002 | Lee et al. |
| 2002/0086507 A1 | 7/2002 | Park et al. |
| 2002/0086555 A1 | 7/2002 | Ahn et al. |
| 2002/0089063 A1 | 7/2002 | Ahn et al. |
| 2002/0090806 A1 | 7/2002 | Ahn et al. |
| 2002/0094632 A1 | 7/2002 | Agarwal et al. |
| 2002/0100418 A1 | 8/2002 | Sandhu et al. |
| 2002/0102818 A1 | 8/2002 | Sandhu et al. |
| 2002/0110991 A1 | 8/2002 | Li |
| 2002/0111001 A1 | 8/2002 | Ahn |
| 2002/0122885 A1 | 9/2002 | Ahn |
| 2002/0130338 A1 | 9/2002 | Ahn et al. |
| 2002/0146916 A1 | 10/2002 | Irino et al. |
| 2002/0155688 A1 | 10/2002 | Ahn |
| 2002/0155689 A1 | 10/2002 | Ahn |
| 2002/0164420 A1 | 11/2002 | Derderian et al. |
| 2002/0167089 A1 | 11/2002 | Ahn et al. |
| 2002/0177282 A1 * | 11/2002 | Song |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2003/0003635 A1 | 1/2003 | Paranjpe et al. |
| 2003/0003702 A1 | 1/2003 | Ahn |
| 2003/0003730 A1 | 1/2003 | Li |
| 2003/0008243 A1 | 1/2003 | Ahn et al. |
| 2003/0017717 A1 | 1/2003 | Ahn |
| 2003/0020169 A1 | 1/2003 | Ahn et al. |
| 2003/0020180 A1 | 1/2003 | Ahn et al. |
| 2003/0032270 A1 | 2/2003 | Snyder et al. |
| 2003/0043637 A1 | 3/2003 | Forbes et al. |
| 2003/0045082 A1 | 3/2003 | Eldridge et al. |
| 2003/0048666 A1 | 3/2003 | Eldridge et al. |
| 2003/0049942 A1 | 3/2003 | Haukka et al. |
| 2003/0059535 A1 | 3/2003 | Luo et al. |
| 2003/0089314 A1 | 5/2003 | Matsuki et al. |
| 2003/0104666 A1 | 6/2003 | Bojarczuk et al. |

| | | |
|---|---|---|
| 2003/0119246 A1 | 6/2003 | Ahn |
| 2003/0119291 A1 | 6/2003 | Ahn et al. |
| 2003/0159653 A1 | 8/2003 | Dando et al. |
| 2003/0170389 A1 | 9/2003 | Sandhu |
| 2003/0170403 A1 | 9/2003 | Doan et al. |
| 2003/0175411 A1 | 9/2003 | Kodas et al. |
| 2003/0181039 A1 | 9/2003 | Sandhu et al. |
| 2003/0183156 A1 | 10/2003 | Dando et al. |
| 2003/0194861 A1 | 10/2003 | Maradian et al. |
| 2003/0194862 A1 | 10/2003 | Maradian |
| 2003/0203626 A1 | 10/2003 | Derderian et al. |
| 2003/0207032 A1 | 11/2003 | Ahn et al. |
| 2003/0207540 A1 | 11/2003 | Ahn et al. |
| 2003/0207564 A1 | 11/2003 | Ahn et al. |
| 2003/0207593 A1 | 11/2003 | Derderian et al. |
| 2003/0209324 A1 | 11/2003 | Fink |
| 2003/0224600 A1 | 12/2003 | Cao et al. |
| 2003/0227033 A1 | 12/2003 | Ahn et al. |
| 2003/0232511 A1 | 12/2003 | Metzner et al. |
| 2003/0235961 A1 | 12/2003 | Metzner et al. |
| 2004/0004244 A1 | 1/2004 | Ahn et al. |
| 2004/0004245 A1 | 1/2004 | Forbes et al. |
| 2004/0004247 A1 | 1/2004 | Forbes et al. |
| 2004/0004859 A1 | 1/2004 | Forbes et al. |
| 2004/0007171 A1 | 1/2004 | Ritala et al. |
| 2004/0009679 A1 | 1/2004 | Yeo et al. |
| 2004/0023461 A1 | 2/2004 | Ahn et al. |
| 2004/0028811 A1 | 2/2004 | Cho et al. |
| 2004/0033661 A1 | 2/2004 | Yeo et al. |
| 2004/0033681 A1 | 2/2004 | Ahn et al. |
| 2004/0033701 A1 | 2/2004 | Ahn et al. |
| 2004/0038525 A1 | 2/2004 | Meng et al. |
| 2004/0038554 A1 | 2/2004 | Ahn |
| 2004/0043541 A1 | 3/2004 | Ahn |
| 2004/0043557 A1 | 3/2004 | Haukka et al. |
| 2004/0043569 A1 | 3/2004 | Ahn |
| 2004/0043635 A1 | 3/2004 | Vaartstra |
| 2004/0065255 A1 | 4/2004 | Yang et al. |
| 2004/0087124 A1 | 5/2004 | Kubota et al. |
| 2004/0099889 A1 | 5/2004 | Frank et al. |
| 2004/0110348 A1 | 6/2004 | Ahn et al. |
| 2004/0110391 A1 | 6/2004 | Ahn et al. |
| 2004/0144980 A1 | 7/2004 | Ahn et al. |
| 2004/0164357 A1 | 8/2004 | Ahn et al. |
| 2004/0168627 A1 | 9/2004 | Conley, Jr., et al. |
| 2004/0171280 A1 | 9/2004 | Conley et al. |
| 2004/0175882 A1 | 9/2004 | Ahn et al. |
| 2004/0183108 A1 | 9/2004 | Ahn |
| 2004/0203254 A1 | 10/2004 | Conley, Jr., et al. |
| 2004/0214399 A1 | 10/2004 | Ahn et al. |
| 2004/0222476 A1 | 11/2004 | Ahn et al. |
| 2004/0235313 A1 | 11/2004 | Frank et al. |
| 2004/0262700 A1 | 12/2004 | Ahn et al. |
| 2004/0266217 A1 | 12/2004 | Kim et al. |
| 2005/0009370 A1 | 1/2005 | Ahn |
| 2005/0020017 A1 | 1/2005 | Ahn et al. |
| 2005/0023578 A1 | 2/2005 | Bhattacharyya |
| 2005/0023584 A1 | 2/2005 | Derderian et al. |
| 2005/0023594 A1 | 2/2005 | Ahn et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0026458 A1 | 2/2005 | Basceri et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0032292 A1 | 2/2005 | Ahn et al. |
| 2005/0034662 A1 * | 2/2005 | Ahn |
| 2005/0037563 A1 | 2/2005 | Ahn |
| 2005/0054165 A1 | 3/2005 | Ahn et al. |
| 2005/0087134 A1 * | 4/2005 | Ahn |
| 2005/0277256 A1 | 12/2005 | Ahn et al. |
| 2005/0280067 A1 | 12/2005 | Ahn et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0024975 A1 | 2/2006 | Ahn et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046522 A1 | 3/2006 | Ahn et al. |

OTHER PUBLICATIONS

Ahn, Kie Y., "Lanthanum Aluminum Oxynitride Dielectric Films", U.S. Appl. No.11/216,474, filed Aug. 31, 2005.*

Ahn, Kie Y., "Zirconium–Doped Gadolinium Oxide Films", U.S. Appl. No. 11/215,578, filed Aug. 29, 2005.*

Nakajima, et al., "Atomic–layer–deposited silicon–nitride/SiO2 stacked gate dielectrics for highly reliable p–metal–oxide–semiconductor filed–effect transistors", *Applied Physics Letters, vol. 77*, (Oct. 2000),2855–2857.

Ritala, M., et al., "Atomic layer deposition of oxide thin films with metal alkoxides as oxygen sources", *Science, 288(5464)*, (Apr. 14, 2000),319–321.

Sneh, Ofer, "Thin film atomic layer deposition equipment for semiconductor processing", *Thin Solid Films, 402(1–2)*, (2002),248–261.

Banerjee, S., "Applications of silicon–germanium–carbon in MOS and bipolar transistors", *Proceedings of the SPIE –The International Society for Optical Engineering, 3212*, (1997), 118–128.

Beensh–Marchwicka, G., et al., "Preparation of thermosensitive magnetron sputtered thin films", *Vacuum, 53(1–2)*, (May 1999), 47–52.

Dalal, Vikram L., et al., "Microcrystalline Germanium Carbide–A new material for PV conversion", *Presented at 2001 NCPV Program Review Meeting*, (2001), 348–349.

Herrold, J., et al., "Growth and properties of microcrystalline germanium–carbide alloys", *Amorphous and Heterogeneous Silicon Thin Films; Fundamentals to Devices –1999 Symposium*, San Francisco, CA, Apr. 5–9 1999, (1999), 561–566.

Herrold, J., et al., "Growth and properties of microcrystalline germanium–carbide alloys grown using electron cyclotron resonance plasma processing", *Journal of Non–Crystalline Solids*(Netherlands), 270(1–3, (May 2000), 255–259.

Hoshino, Y., et al., "Characterization and Control of the HfO2/Si(001) Interfaces", *Applied Physics Letters, 81*, (Sep. 30, 2002), 2650–2652.

Kouvetakis, J. et al., "Novel chemical routes to silicon–germanium–carbon materials", *Applied Physics Letters, 65(23)*, (Dec. 5, 1994), 2960–2962.

Lopez, E., et al., "Laser assisted integrated processing of SiGeC films on silicon", *Thin Solid Films, vol. 453–454*, (Apr. 1, 2004), 46–51.

OHMI, S., et al., "Rare Earth Metal Oxides for High–K Gate Insulator", *Electrochemical Society Proceedings, vol. 2002–2*, (2002), 376–387.

Summonte, C., et al., "Wide band–gap silicon–carbon alloys deposited by very high frequency plasma enhanced chemical vapor deposition", *Journal of Applied Physics, 96(7)*, (Oct. 1, 2004), 3987–3997.

Tyczkowski, J., et al., "Electronic band structure of insulating hydrogenated carbon–germanium films", *Journal of Applied Physics, 86(8)*, (Oct. 15, 1999), 4412–4418.

Chin, A., et al., "High Quality La2O3 and Al2O3 Gate Dielectrics with Equivalent Oxide Thickness 5–10A", *Digest of Technical Papers, 2000 Symposium on VLSI Technology, 2000*, Honolulu, (Jun. 13–15, 2000), 16–17.

Copel, M., et al., "Formation of a stratified lanthanum silicate dielectric by reaction with Si(001)", *Applied Physics Letters, 78(11)*, (Mar. 12, 2001), 1607–1609.

Dimoulas, A., et al.; "Structural and electrical quality of the high–k dielectric Y2O3 on Si (001): Dependence on growth parameters", *Journal of Applied Physics, 92(1)*, (Jul. 1, 2002), 426–431.

Guha, S., et al., "Atomic beam deposition of lanthanum–and yttrium–based oxide thin films for gate dielectrics", *Applied Physics Letters, 77*, (2000), 2710–2712.

Hoshino, Y., et al., "Characterization and Control of the HfO2/Si(001) Interfaces", *Applied Physics Letters, 81*, (Sep. 30, 2002), 2650–2652.

Huang, C. H., et al., "La/sub 2/O/sub 0.3/Ge/sub 0.7/ p–MOSFETs with high hole mobility and good device characteristics", *IEEE Electron Device Letters, 23(12)*, (Dec. 2002), 710–712.

Iwai, H., et al., "Advanced gate dielectric materials for sub–100 nm CMOS", *International Electron Devices Meeting, 2002. IEDM '02. Digest.*, (Dec. 8–11, 2002), 625–628.

Kwo, J., et al., "High E gate dielectrics Gd2O3 and Y2O3 for silicon", *Applied Physics Letters, 77(1)*, (Jul. 3, 2000), 130–132.

Maria, J. P., et al., "High temperature stability in lanthanum and zirconia–based gate dielectrics", *Journal of Applied Physics, 90(7)*, (Oct. 1, 2001), 3476–3482.

Michaelson, Herbert B., "The work function of the elements and its periodicity", *Journal of Applied Physics, 48(11)*, (Nov. 1977), 4729–4733.

Shimizu, Takashi, et al., "Electrical Properties of Ruthenium/Metalorganic Chemical Vapor Deposited La–Oxide/Si Field Effect Transistors", *Jpn. J. Appl. Phys., vol. 42, Part 2. No. 11A*, (2003), L1315–L1317.

Tewg, J. Y., et al., "Electrical and Physical Characterization of Zirconium–Doped Tantaium Oxide Films", *Electrochemical Society Proceedings, vol. 2002–28*, (2002), 75–81.

Yamada, Hirotoshi, et al., "MOCVD of High–Dielectric–Constant Lanthanum Oxide Thin Films", *Journal of The Electrochemical Society, 150(8)*, (Aug. 2003), G429–G435.

Zhong, Huicai, et al., "Electrical Properties of Ru and RuO2 Gate Electrodes for Si–PMOSFET with ZrO2 and Zr–Silicate Dielectrics", *Journal of Electronic Materials, 30(12)*, (Dec. 2001), 1493.

*Copy of PCT Search Report dated Oct. 15, 2003 for application PCT/US03/17730 completed by S. Nesso*, "Improved Metallurgy for Wiring Very Large Scale Integrated Circuits", *International Technology Disclosures, 4*, Abstract, (1986), 1 page.

Braud, F., "Ultra Thin Diffusion Barriers for Cu Interconnections at the Gigabit Generation and Beyond", *VMIC Conference Proceedings*, (1996), 174–179.

Callegari, A., et al., "Physical and electrical characterization of Hafnium oxide and Hafnium silicate sputtered films", *Journal of Applied Physics, 90(12)*, (Dec. 15, 2001), 6466–75.

Chang, Hyo S., et al., "Excellent thermal stability of Al2O3/ZrO2/Ai2O3 stack structure of metal–oxide–semiconductor gate dielectrics application", *Applied Physics Letters, 80(81)*, (May 6, 2002), 3385–7.

Chen, P. J., et al., "Thermal stability ans scalability of Zr–aluminate–based high–k gate stacks", *Symposium on VLSI Technology Digest*, (2002), 192–3.

Clark, P, "IMEC Highlights Hafnium, Metal Gates for High–k Integration", *Semiconductor Business News*, at Silicon Strategies.com, (Oct. 11, 2002), 2 pages.

Colombo, D., et al., "Anhydrous Metal Nitrates as Volatile Single Source Precursors for the CVD of Metal Oxide Films", *Communications, Department of EE, U of M, Mpls, MN*, (Jul. 7, 1998), 3 pages.

Conley, Jr., J. F., et al., "Atomic Layer Deposition of Hafnium Oxide Using Anhydrous Hafnium Nitrate", *Electrochemical and Solid–State Lett., 5, (5)*, (2002), C57–C59.

Da Rosa, E. B., et al., "Annealing of ZrAl/sub x/O/sub y/ ultrathin films on Si in a vacuum or in O/sub 2/", *Journal of the Electrochemical Society, 148 (12)*, (Dec. 2001), G695–G703.

Ding, "Cooper Barrier, Seed Layer and Planerization Technologies", *VMIC Conference Proeedings*, (1997), 87–92.

Guo, Xin, et al., "High quality ultra–thin (1.5 nm) TiO2–Si3N 4 gate dielectric for deep sub–micron CMOS technology", *IEDM Technical Digest. International Electron Devices Meeting*, Ctied in related application, (Dec. 5–8, 1999), 137–140.

Iijima, T., "Microstructure and Electrical Properties of Amorphous W–Si–N Barrier Layer for Cu Interconnections", *1996 VMIC Conference*, (1996), 168–173.

Jeon, Sanghun, et al., "Ultrathin nitrded–nanolaminate (Al2O3/ZrO2/Al2O3) for metal?oxide?semiconductor gate dielectric applications", *Journal of Vacuum Science & Technology B: Microelectronics and Nanometer Structures, 20(3)*, (May 2002), 1143–5.

Laursen, T., "Encapsulation of Cooper by Nitridation of Cu–Ti Alloy/Bilayer Structures", *International Conference on Metallurgical Coatings and Thin Films*, Abstract No. H1.03, San Diego, CA, (Apr. 1997), 309.

Lee, S. J., et al., "Hafnium oxide gate stack prepared by in situ rapid thermal chemical vapor deposition process for advanced gate dielectrics", *Journal of Applied Physics, 92 (5)*, (Sep. 1, 2002), 2807–09.

Luan, et al., "High Quality Ta2O5 Gate Dielectrics and T[....]", *IEEE Technical Digest of Int. Elec. Devices Mtng 1999*, (1999), 141–142.

Park, Byoung K., et al., "Interfacial reaction between chemically vapor–deposited HfO2 thin films and a HF–cleaned Si substrate during film growth and postannealing", *Applied Physics Letters, 80(13)*, (Apr. 1, 2002), 2368–70.

Ryu, Changsup, "Barriers for Cooper Interconnections", *Solid State Technology, 42(4)*, (Apr. 1999), pp. 1–3.

Smith, Ryan C., et al., "Chemical Vapour Deposition of the Oxides of Titanium, Ziroconium and Hafnium for Use as High–k Materials in Microelectronic Devices. A Carbon–free Precursors for the Synthesis of Hafnium Dioxide", *Advanced Materials for Optics and Electronics, 10(3–5)*, (Jun. 29, 2000), 105–14.

Souche, D. et al., "Visible and Infrared ellipsometry study of ion assisted SiO2 films", *Thin Solid Films, 313–314*, (1998), 676–681.

Stathis, J. H., et al., "Reliability Projection for Ultra–Thin Oxides at Low Voltage", *Tech. Dig. International Electron Device Meeting*,(1998),167–9.

Yamamoto, K., et al., "Effect of Hf metal predeposition on the properties of sputtered HfO2/Hf stacked gate dielectrics", *Applied Physics Letters, 81(11)*,(Sep. 9, 2002),2053–5.

Abe, et al., "Silicon Wafer–Bonding Process Technology for SOI Structures", *Conference on Solid State Devices and Materials*,Sponsored by The Japan Society of Applied Physics,(1990),853–856.

Adler, E., et al., "The Evolution of IBM CMOS DRAM Technology", *IBM Journal of Research & Developement, 39(1–2)*, (Jan.–Mar. 1995),167–188.

Asai, S., et al., "Technology Challenges for Integration Near and Below 0.1 micrometer", *Proceedings of the IEEE, 85(4)*, Special issue on Nanometer–Scale Science & Technology, (Apr. 1997),505–520.

Auberton–Herve, A. J., "SOI: Materials to Systems", *Digest of the International Electron Device Meeting*, San Francisco,(Dec. 1996),3–10.

Banerjee, S. K., et al., "Characterization of Trench Transistors for 3–D Memories", *1986 Symposium on VLSI Technology, Digest of Technical Papers*,San Diego, CA(May 1986),79–80.

Bengtsson, Stefen, et al., "Interface charge control of directly bonded silicon structures", *J. Appl. Phys., vol. 66, No. 3*,(Aug. 1989),1231–1239.

Blalock, T. N., et al., "A High–Speed Sensing Scheme for 1T Dynamic RAM's Utilizing the Clamped Bit–Line Sense Amplifier", *IEEE Journal of Solid–State Cicuits, 27(4)*,(Apr. 1992),pp. 618–624.

Bomchil, G., et al., "Porous Silicon: The Material and its Applications in Silicon–On–Insulator Technologies", *Applied Surface Science, 41/42*,(1989),604–613.

Burnett, D., et al., "Implications of Fundamental Threshold Voltage Variations for High–Density SRAM and Logic Circuits", *1994 Symposium on VLSI Technology, Digest of Technical Papers*,Honolulu, HI,(Jun. 1994),15–16.

Burnett, D., et al., "Statistical Threshold–Voltage Variation and its Impact on Supply–Voltage Scaling", *Proceedings SPIE: Microelectronic Device and Multilevel Interconnection Technology, 2636*,(1995),83–90.

Cartagena, et al., "Bonded Etchback Silicon on Sapphire Bipolar Junction Transistors", *In: The Electrochemical Society Interface, 2(1)*,Program and Abstracts: 183rd Meeting of the Electrochemical Society Pennington, NJ,(1993),2 pages.

Chen, M. J., et al., "Back–Gate Forward Bias Method for Low–Voltage CMOS Digital Cicuits", *IEEE Transactions on Electron Devices, 43*,(Jun. 1996),904–909.

Chen, M. J., et al., "Optimizing the Match in Weakly Inverted MOSFET's by Gated Lateral Bipolar Action", *IEEE Transactions on Electron Devices, 43*,(May 1996), 766–773.

Chesler, R., et al., "Solid–State Ionic Laser", *In: Laser Handbook, vol. 1*,Arecchi, F.T., et al., (eds), North–Holland Publishing Company, Amsterdam,(1972),p. 353.

Chung, I. Y., et al., "A New SOI Inverter for Low Power Applications", *Proceedings of the 1996 IEEE International SOI Conference*, Sanibel Island, Fl.,(1996),20–21.

De, V. K., et al., "Random MOSFET Parameter Fluctuation Limits to Gigascale Integration (GSI)", *1996 Symposium on VLSI Technology, Digest of Technical Papers*,Honolulu, HI,(Jun. 11–13, 1996),198–199.

Denton, J. P., et al., "Fully Depleted Dual–Gated Thin–Film SOI P–MOSFET's Fabricated in SOI Islands with an Isolated Buried Polysilicon Backgate", *IEEE Electron Device Letters, 17(11)*,(Nov. 1996),pp. 509–511.

Fong, Y., et al., "Oxides Grown on Textured Single–Crystal Silicon—Dependence on Process and Application in EEPROMs", *IEEE Transactions on Electron Devices, 37(3)*, (Mar. 1990),pp. 583–590.

Forbes, L., et al., "Resonant Forward–Biased Guard–Ring Diodes for Suppression of Substrates Noise in Mixed–Mode CMOS Circuits", *Electronics Letters, 31*,(Apr. 1995),720–721.

Foster, R., et al., "High Rate Low–Temperature Selective Tungsten", *In:Tungsten and Other Refractory Metals for VLSI Applications III*,V.A. Wells, ed., Materials Res. Soc., Pittsburgh, PA,(1988),69–72.

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*,(1997),286–287.

Gagliano, F. P., et al., "Laser Processing Fundamentals", *In Lasers in Industry*,edited by S. S. Charschan, Van Nostrand Reinhold Company,(1972),156–164.

Gartner, M, et al., "Spectroellipsometric characterization of lanthanide–doped TiO2 films obtained via the sol–gel technique", *Thin Solid Films, 234(1–2)*,(1993),561–565.

Gong, S., et al., "Techniques for reducing switching noise in high speed digital systems", *Proceedings Eighth Annual IEEE International ASIC Conference and Exhibit*,(1995), 21–24.

Gosele, U., et al., "Self–propagating Room–temperature Silicon Wafer Bonding in Ultrahigh Vacuum", *Applied Physics Letters, 67(24).*,(Dec. 11, 1995),3614–3616.

Hao, M. Y., et al., "Electrical Characteristics of Oxynitrides Grown on Textured Single–Crystal Silicon", *Appl. Phys. Lett., 60*,(Jan. 1992),445–447.

Kim, Y., et al., "Substrate dependence on the optical properties of Al2O3 films grown by atomic by atomic layer deposition", *Applied Physics Letters*,(Dec. 1997),pp. 3604–3606.

Kishimoto, T., et al., "Well Structure by High–Energy Boron Implantation for Soft–Error Reduction in Dynamic Random Access Memories (DRAMs)", *Japanese Journal of Applied Physics, 34*,(Dec. 1995),6899–6902.

Kohyama, Y., et al., "Buried Bit–Line Cell for 64MB DRAMs", *1990 Symposium on VLSI Technology, Digest of Technical Papers*,Honolulu, HI,(Jun. 4–7, 1990),17–18.

Koshida, N., et al., "Efficient Visible Photoluminescene from Porous Silicon", *Japanese Journal of Applied Physics, 30*,(Jul. 1991),L1221–L1223.

Kuge, S., et al., "SOI–DRAM Circuit Technologies for Low Power High Speed Multigigia Scale Memories", *IEEE Journal of Solid–State Circuits, 31(4)*,(Apr. 1996),pp. 586–591.

Kukli, Kaupo, et al., "Low–Temperature Deposition of Zirconium Oxide–Based Nanocrystalline Films by Alternate Supply of Zr[OC(CH3)3]4 and H2O", *Chemical Vapor Deposition, 6(6)*,(2000),297–302.

Lantz, II, L., "Soft Errors Induced By Alpha Particles", *IEEE Transactions on Reliability, 45*,(Jun. 1996),174–179.

Lasky, J. B., "Wafer Bonding for Silicon–on–Insulator Technologies", *Applied Physics Letters, 48(1)*,(Jan. 6, 1986), 78–80.

Lee, B. H., et al., "Novel Pattern Transfer Process for Bonded SOI Giga–bit DRAMs", *IEEE International SOI Conference*,Piscataway, NJ,(1996),114–115.

Lehmann, V., "The Physics of Macropore Formation in Low Doped n–Type Silicon", *Journal of the Electrochemical Society, 140(10)*,(Oct. 1993),2836–2843.

Lu, D., et al., "Bonding Silicon Wafers by Use of Electrostatic Fields Followed by Rapid Thermal Heating", *Materials Letters, 4(11)*,(Oct. 1986),461–464.

Lu, N. et al., "The SPT Cell —A New Substrate–Plate Trench Cell for DRAMs", *1985 IEEE International Electron Devices Meeting, Technical Digest*,Washington, D.C.,(Dec. 1–4, 1985),771–772.

Macsweeney, D., et al., "Modeling of Lateral Bipolar Devices in a CMOS Process", *IEEE Bipolar Circuits and Technology Meetings*,Minneapolis, MN,(Sep. 1996),27–30.

Maeda, S., et al., "A Vertical Phi–Shape Transistor (VPhiT) Cell for 1 Gbit DRAM and Beyond", *1994 Symposium of VLSI Technology, Digest of Technical Papers*,Honolulu, HI,(Jun. 7–9, 1994),133–134.

Maeda, S., et al., "Impact of a Vertical Phi–Shape Transistor (VPhiT) Cell for 1 Gbit DRAM and Beyond", *IEEE Transactions on Electron Devices, 42*,(Dec. 1995),2117–2123.

Malaviya, S., *IBM TBD, 15*,(Jul. 1972),p. 42.

Masu, K., et al., "Multilevel Metallization Based on Al CVD", *1996 IEEE Symposium on VLSI Technology, Digest of Technical Papers*,Honolulu, HI,(Jun. 11–13, 1996),44–45.

Mccredie, B. D., et al., "Modeling, Measurement, and Simulation of Simultaneous Switching Noise", *IEEE Transactions on Components, Packaging, and Manufacturing Technology –Part B, 19*,(Aug. 1996),461–472.

Mumola, P. B., et al., "Recent Advances in Thining of Bonded SOI Wafers by Plasma Assisted Chemical Etching", *Electrochemical Society Proceedings, 95–7*,(1995),28–32.

Nakajima, Anri, "Soft breakdown free atomic–layer–deposited silicon–nitride/SIO/sub 2/ stack gate dielectrics", *International Electron Devices Meeting, Technical Digest,* (2001),6.5.1–4.

Nakamura, et al., "Giga–bit DRAM Cells with Low Capacitance and Low Resistance Bit–Lines on Buried MOSFFET's and Capacitors by Using Bonded SOI Technology –Reversed–Stacked–Capacitor (RSTC) Cell–", *Technical Digest–International Electron Devices Meeting*,(1995), 889–892.

Nitayama, A., et al., "High Speed and Compact CMOS Circuits with Multipillar Surrounding Gate Transistors", *IEEE Transactions on Electron Devices, 36*,(Nov. 1989), 2605–2606.

Ohba, T., et al., "Evalution on Selective Deposition of CVD W Films by Measurement of Surface Temperature", *In: Tungsten and Other Refractory Metals for VLSI Applications II*,Materials Research Society, Pittsburgh, PA,(1987), 59–66.

Ohba, T., et al., "Selective Chemical Vapor Deposition of Tungsten Using Silane and Polysilane Reductions", *In: Tungsten and Other Refractory Metals for VLSI Applications IV*,Materials Research Society, Pittsburgh, PA,(1989), 17–25.

Ohno, Y., et al., "Estimation of the Charge Collection for the Soft–Error Immunity by the 3D–Device Simulation and the Quantitative Investigation", *Simulation of Semiconductor Devices and Processes, 6*,(Sep. 1995), 302–305.

Oowaki, Y., et al., "New alpha–Particle Induced Soft Error Mechanism in a Three Dimensional Capacitor Cell", *IEICE Transactions on Electronics, 78–C*,(Jul. 1995),845–851.

Oshida, S., et al., "Minority Carrier Collection in 256 M–bit DRAM Cell on Incidence of Alpha–Particle Analyzed by Three–Dimensional Device Simualtion", *IEICE Transactions on Electronics, 76–C*,(Nov. 1993),1604–1610.

Ozaki, T., et al., "Surrounding Isolation–Merged Plate Electrode (SIMPLE) Cell with Checkered Layout for 256Mbit DRAMs and Beyond", *1991 IEEE International Electron Devices Meeting*,Washington, D.C.,(Dec. 8–11, 1991),469–472.

Parke, S. A., et al., "A High–Performance Lateral Bipolar Transistor Fabricated on SIMOX", *IEEE Electron Device Letters, 14*,(Jan. 1993),33–35.

Pein, H., et al., "A 3–D Sidewall Flash EPROM Cell and Memory Array", *IEEE Transactions on Electron Devices, 40*,(Nov. 1993),2126–2127.

Pein, H., et al., "Performance of the 3–D Pencil Flash EPROM Cell and Memory Array", *IEEE Transactions on Electron Devices, 42*,(Nov. 1995),1982–1991.

Su, D. K., et al., "Experimental Results and Modeling Techniques for Substrate Noise in Mixed–Signal Intregrated Circuits", *IEEE Journal of Solid–State Circuits, 28(4)*,(Apr. 1993),420–430.

Suma, K., et al., "An SOI–DRAM with Wide Operating Voltage Range by CMOS/SIMOX Technology", *IEEE Journal of Solid–State Circuits, 29(11)*,(Nov. 1994),pp. 1323–1329.

Sunouchi, K., et al., "A Surrounding Gate Transistor (SGT) Cell for 64/256Mbit DRAMs", *1989 IEEE International Electron Devices Meetings, Technical Digest*,Washington, D.C.,(Dec. 3–6, 1989),23–26.

Sunouchi, K., et al., "Process Integration for 64M DRAM Using an Asymmetrical Stacked Trench Capacitor (AST) Cell", *1990 IEEE International Electron Devices Meeting*, San Francisco, CA,(Dec. 9–12, 1990),647–650.

Sze, S. M., *In: Physics of Semiconductor Devices, Second Edition*,John Wiley & Sons, New York,(1981),p. 42.

Takai, M., et al., "Direct Measurement and Improvement of Local Soft Error Susceptibility in Dynamic Random Access Memories", *Nuclear Instruments & Methods in Physics Research, B–99*,(Nov. 7–10, 1994),562–565.

Takato, H., et al., "High Performance CMOS Surrounding Gate Transistor (SGT) for Ultra High Density LSIs", *IEEE International Electron Devices Meeting, Technical Digest*, (1988),222–225.

Takato, H., et al., "Impact of Surrounding Gate Transistor (SGT) for Ultra–High Density LSI's", *IEEE Transactions on Electron Devices, 38*,(Mar. 1991),573–578.

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*,Kyoto, Japan,(Jun. 6–8, 1995),123–124.

Temmler, D., "Multilayer Vertical Stacked Capacitors (MVSTC) for 64Mbit and 256Mbit DRAMs", *1991 Symposium on VLSI Technology, Digest of Technical Papers,* (May 28–30, 1991),13–14.

Terauchi, M., "A Surrounding Gate Transistor (SGT) Gain Cell for Ultra High Density DRAMs", *1993 Symposium on VLSI Technology, Digest of Technical Papers*,Kyoto, Japan, (1993),21–22.

Tong, Q., et al., "Hydrophobic Silicon Wafer Bonding", *Applied Physics Letter 64(5)*,(Jan. 31, 1994),625–627.

Tsui, P. G., et al., "A Versatile Half–Micron Complementary BiCMOS Technology for Microprocessor–Based Smart Power Applications", *IEEE Transactions on Electron Devices, 42,*(Mar. 1995),564–570.

Verdonckt–Vandebroek, S., et al., "High–Gain Lateral Bipolar Action in a MOSFET Structure", *IEEE Transactions on Electron Devices 38,*(Nov. 1991),2487–2496.

Vittal, A., et al., "Clock Skew Optimization for Ground Bounce Control", *1996 IEEE/ACM International Conference on Computer–Aided Design, Digest of Technical Papers,*San Jose, CA,(Nov. 10–14, 1996),395–399.

Wang, N., *Digital MOS Integrated Circuits,*Prentice Hall, Inc., Englewood Cliffs, NJ,(1989),p. 328–333.

Wang, P. W., et al., "Excellent Emission Characteristics of Tunneling Oxides Formed Using Ultrathin Silicon Films for Flash Memory Devices", *Japanese Journal of Applied Physics, 35,*(Jun. 1996),3369–3373.

Watanabe, H., et al., "A New Cylindrical Capacitor Using Hemispherical Grained Si (HSG–Si) for 256Mb DRAMs", *International Electron Devices Meeting, Technical Digest,* San Francisco, CA,(Dec. 13–16, 1992),259–262.

Watanabe, S., et al., "A Novel Circuit Technology with Surrounding Gate Transistors (SGT's) for Ultra High Density DRAM's", *IEEE Journal of Solid–State Circuits, 30,*(Sep. 1995),960–971.

Watanabe, H., "A Novel Stacked Capacitor with Porous–Si Electrodes for High Density DRAMs", *1993 Symposium on VLSI Technology, Digest of Technical Papers,*Kyoto, Japan, (1993),17–18.

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials,*Yokohama, Japan,(1991),478–480.

Watanabe, H., et al., "Device Application and Structure Observation for Hemispherical–Grained Si", *J. Appl. Phys., 71,*(Apr. 1992),3538–3543.

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials,*Tsukuba, Japan,(1992),422–424.

Weldon, M. K., et al., "Physics and Chemistry of Siliocn Wafer bonding Investigated by Infrared Absorption Spectroscopy", *Journal of Vaccuum Sci. Technology, B 14(4), c1996 American Vacuum Society,*(Jul./Aug. 1996),3095–3106.

Wolf, S., et al., *In: Silicon Processing of the VLSI Era, vol. 1,*Lattice Press,374–380.

Yamada, T., et al., "A New Cell Structure with a Spread Source/Drain (SSD) MOSFET and a Cylindrical Capacitor for 64–Mb DRAM's", *IEEE Transactions on Electron Devices, 38,*(Nov. 1991),2481–2486.

Yamada, T., et al., "Spread Source/Drain (SSD) MOSFET Using Selective Silicon Growth for 64Mbit DRAMs", *1989 IEEE Transactions on Electron Devices, 38,*(Nov. 1991), 2481–2486.

Yamada, T., et al., "Spread Source/Drain (SSD) MOSFET Using Selective Silicon Growth for 64Mbit DRAMs", *1989 IEEE International Electron Devices Meeting, Technical Digest,*Washington, D.C.,(Dec. 3–6, 1989),35–38.

Yeh, Ching–Fa, et al., "The advanced improvement of PN mesa junction diode prepared by silicon–wafer direct bonding", *1991 International Symposium on VLSI Technology, Systems, and Applications, 1991. Proceedings of Technical Papers,*(May 22–24, 1991),136–140.

U.S. Appl. No. 02/0089023, filed Jul. 11, 2002, Yu, Z., et al.

*International Technology for Semiconductor Roadmap,* Semiconductor Industry Association, http://public.itrs.net/Files/2001ITRS/Links/1999_SIA_Roadmap/,(1999).

Aarik, J., et al., *Thin Solid Films, 340,*(1999);110–116.

Aarik, Jaan, et al., "Atomic layer growth of epitaxial TiO/sub 2/ thin films from TiCl/sub 4/ and H/sub 2/O on alpha –Al/sub 2/O/sub 3/ substrates", *Journal of Crystal Growth, vol. 242, No. 1–2,*(2002),189–198.

Aarik, Jaan, et al., "Phase transformations in hafnium dioxide thin films grown by atomic layer doposition at high temperatures", *Applied Surface Science, 173,*(2001),15–21.

Aarik, Jaan, et al., "Texture development in nanocrystalline hafnium dioxide thin films grown by atomic layer deposition", *Journal of Crystal Growth,*(2000),pp. 105–113.

Ahn, Kie Y., et al., "Highly Reliable Amorphous High–K Gate Oxide ZrO2", *Micron Docket No. 01–0516,*(May 17, 2001),3 pages.

Alen, Petra, et al., "Atomic Layer deposition of Ta(Al)N(C) thin films using trimethylaluminum as a reducing agent", *Journal of the Electrochemical Society, vol 148, No. 10,*(Oct. 2001),G566–G571.

Bendoraitis, J. G., et al., *Jour. Phys. Chem., 69(10),*(1965), 3666–3667.

Bright, A. A., et al., "Low–rate plasma oxidation of Si in a dilute oxygen/helium plasma for low–temperature gate quality Si/Sio2 interfaces", *Applied Physics Letters,*(Feb. 1991), pp. 619–621.

Bunshahm Rointan F., et al., "Deposition Technologies for Films and Coatings: Developments and Applications", Noyes Publications,102–103, no date Available.

Cava, R.J., et al., "Improvement of the dielectric properties of Ta/sub 2/O/sub 5/ through substitution with Al/sub 2/O/sub 3/", *Applied Physics Letters, vol. 70, No. 11,*(Mar. 1997),1396–8.

Cheng, Baohong, et al., "The Impact of High–k Gate Dielectrics and Metal Gate Electrodes on Sub–100nm MOSFETs", *IEEE Transactions on Electron Devices,*(1999),1537–1544

Copel, M., et al., "Structure and stability of ultrathin zirconium oxide layers on Si(001)", *Applied Physics Letters, vol. 76, No. 4,*(Jan. 2000),436–438.

De Flaviis, Franco, et al., "Planar microwave integrated phase–shifter design with high purity ferroelectric material", *IEEE Transactions on Microwave Theory & Techniques, vol. 45, No. 6,*(Jun. 1997),963–969.

Desu, S. B., "Miniization of Fatigue in Ferroelectric Films", *Phys. Stat. Sol. (a) 151,*(1995),467–480.

Dusco, C, et al., "Deposition of tin oxide into porous silicon by atomic layer epitaxy", *J. Electrochem. Soc., 143,*(1996), 683–687.

El–Kareh, B, et al., "The evolution of DRAM cell technology", *Solid State Technology,*(1997),89.

Engelhardt, M., "Modern Applications of Plasma Etching and Patterning in Silicon Process Technology", *Contrib. Plasma. Phys., 39(5),*(1999),473–478.

Forsgreen, K. *Comprehensive Summaries of Uppsala Dissertation from the Faculty of Science and Technology, 665,* (2001),37.

Forsgren, Katarina, et al., "Atomic Layer Deposition of HfO2 using hafnium iodide", *Conference held in Monterey, California,*(May 2001),1 page.

Fuyuki, Takashi, et al., "Electronic Properties of the Interface between Si and TiO2 Deposited at Very Low Temperatures", *Journal of Applied Physics,*(1986),1288–1291.

Fuyuki, Takashi, et al., "Initial stage of ultra–thin SiO2 formation at low temperatures using activated oxygen", *Applied Surface Science,*(1997),pp. 123–126.

Garter, M., et al., "Spectroellipsometric characterization of lanthanide–doped TiO2 films obtained via the sol–gel technique", *thin Solid Films,*234,(1993),pp. 561–565.

Geller, S., et al., "Crystallograhic Studies of Perovskite–like Compounds. II. Rare Earth Aluminates", *Acta Cryst. vol. 9,*(May 1956),1019–1025.

Giess, E. A., et al., "Lanthanide gallate perovskite–type substrates for epitaxial, high–Tc superconducting Ba2YCu3O7–films", *IBM J. Res. Develop. vol. 34, No. 6,*(Nov. 1990),916–926.

Guillamot, B, et al., *Technical Digest of International Electron Devices Meeting 2002,*(2002),355–358.

Gusev, E. P., et al., "Ultrathin High–K Dielectrics Grown by Atomic Layer Deposition: A Comparative Study of ZrO2, HfO2, Y2O3 and Al2O3", *Electrochemical Society Proceedings vol. 2001–9,*(2001),189–195.

Gutowski, M. J., *J. Appl. Phys., 80,*(2002),1897–1899.

Hirayama, Masaki, et al., "Low–Temperature Growth of High–Integrity Silicon Oxide Films by Oxygen Radical Generated in High Density Krypton Plasma", *IEDM Technical Digest,*(1999),249–252.

Hubbard, K. J., et al., "Thermodynamic stability of binary oxides in contact with silicon", *J. Mater. Res.,*(Nov. 1996), 2757–2776.

Hunt, C. E., et al., "Direct bonding of micromachined silicon wafers for laser diode heat exchanger applications", *J. Micromeng. Micromech., 1,*(1991),152–156.

Iddles, D. M., et al., "Relationships between dopants, microstructure and the microwave dielectric properties of ZrO2–TiO2–SnO2 ceramics", *Journal of Materials Science, vol. 27,*(1992),6303–6310.

Jeon, Sanghun, et al., "Excellent Electrical Characteristics of Lanthanide (Pr,Nd,Sm,Gd, and Dy) Oxide and Lanthanide–doped Oxide for MOS Gate Dielectric Applications", *Technical Digest of IEDM,*(2001),471–474.

Jeong, Chang–Wook, et al., "Plasma–Assisted Atomic layer Growth og High–Quality Aluminum Oxide Thin Films", *Jpn. J. Appl. Phys., vol. 40,*(Jan. 2001),285–289.

Jung, H. S., et al., *Technical Digest of International Electron Devices Meeting 2002,*(2002),853–856.

Kang, L., et al., *Tech. Dig. Int. Electron Devices Meet., 2000,*(2000),35.

Kawai, Y, et al., "Ultra–low–temperature growth of high–integrity gate oxide films by low–energy Ion–assisted oxidation", *Applied Physics Letters,*(Apr. 1994),pp. 2223–2225.

Keomany, D., et al., "Sol gel preparation of mixed cerium–titanium oxide thin films", *Sol. Energy Mater. So. Cells, 33,*(1994),pp. 429–441.

Kim, Y. W., et al., *Technical Digest of International Electron Devices Meeting 2002,*(2002),69–72.

Kim, C. T., et al., "Application of Al2O3 Grown by atomic Layer Deposition to DRAM and FeRAM", *International Symposium in Integrated Ferroelectrics,*(Mar. 2000),pp. 316.

Kim, D., et al., "Atomic Control of Substrate Termination and Heteroepitaxial Growth of SrTiO3/LaAlO3 Films", *Journal of the Korean Physical Society vol. 36 No. 6,*(Jun. 2000),444–448.

Kim, Byoung–Youp, et al., "Comparsion study for TiN films deposited from different method: chemical vapor deposition and atomic layer deposition", *Mechanisms of Surface and Microstructure Evolution in Deposited Films and Film Structures Symposium (Materials Research Society Symposium Proceedings vol.672),*(2001),7.8.1–7.8.6.

Kim, Taeseok, et al., "Correlation between strain and dielectric properties in ZrTiO/sub 4/ thin films", *Applied Physics Letters, vol. 76, No. 21,*(May 2000),3043–3045.

Kim, Taeseok, et al., "Dielectric properties and strain analysis in paraelectric ZrTiO/sub 4/ thin films deposited by DC magnetron sputtering", *Japanese Journal pf Applied Physics Part 1–Regular Papers Short Notes & Review Papers, vol. 39, No.7A,*(2000),4153–4157.

Kim, Yongjo, et al., "Effect of microstructures on the microwave dielectric properties of ZrTiO/sub 4/ thin films", *Applied Physics Letters, vol. 78, No. 16,*(Apr. 2001),2363–2365.

Kim, Y., et al., "Substrate dependence on the opitcal properties of Al2O3 films grown by atomic layer deposition", *Appl. Phys. Lett. v. 71, n. 25,*(Dec. 1997),3604–3606.

Krauter, G., et al., "Room Temperature Silicon Wafer Bonding with Ultra–Thin Polymers Films", *Advanced Materials, 9(5),*(1997),417–420.

Kukli, K. J., et al., *J. Appl. Phys., 80,*(2002),5698–5703.

Kukli, K., et al., *Thin Solid Films, 416,*(2002),72–79.

Kukli, Kaupo, et al., "Atomic Layer Deposition of Titanium Oxide Ti14 and H2O2", *Chem. Vap. Deposition, vol. 6, No. 6,*(2000),72–79.

Kukli, K., et al., "Controlled Growth of Yttrium Oxysulphide Thin Fims by Atomic Layer Deposition", *Materials Science Forum,*(1999),216–221.

Kukli, Kaupo, et al., "Dielectric Properties of Zirconium Oxide Grown by Atomic Layer Deposition from Iodide Precursor", *Journal of The Electrochemical Society, 148(12),*(2001),F227–F232.

Kukli, K., et al., "Influence of thickness and growth temperature on the properties of zirconium oxide films growth by atomic layer deposition on silicon", *Thin Solid Films, 410,*(2002),53–60.

Lee, J. H., et al., *Technical Digest of International Electron Devices Meeting 2002,*(2002),221–224.

Lee, B. H., et al., *Tech. Dig. Int. Electron Devices Meet., 2000,*(2000),39.

Lee, S. J., et al., *Tech. Dig. Int. Electron Devices Meet., 2000,*(2000),31.

Lee, A. E., et al., "Epitaxially grown sputtered LaAlO3 films", *Appl. Phys. Lett. 57(19),*(Nov. 1990),2019–2021.

Lee, Cheng–Chung, et al., "Ion–assisted deposition of silver thin films", *Thin Solid Films,*359,(2000),pp. 95–97.

Lee, Dong H., et al., "Metalorganic chemical vapor deposition of TiO2:N anatase thin film on Si Substrate", *Appl. Phys. Lett., 66(7),*(Feb. 1995),815–816.

Lee, L. P., et al., "Monolithic 77 K dc SQUID magnetometer", *Appl. Phys. Lett. 59(23),*(Dec. 1991),3051–3053.

Lee, C. H., et al., "MOS Characteristics of Ultra Thin Rapid Thermal CVD ZrO2 and Zr Silicate Gate Dielectrics", *IEDM,*(2000),pp. 27–30.

Lee, C. H., et al., "MOS Devices with High Quality Ultra Thin CVD ZrO2 Gate Dielectrics and Self–Aligned TaN and TaN/Poly–Si Gate electrodes", *2001 Symposium on VLSI, Technology Digest of Technical Papers*,(2001),137–138.

Lee, Byoung H., et al., "Ultrathin Hafnium Oxide with Low Leakage and Excellent Reliability for Alternative Gate Dielectric Application", *Technical Digest of IEDM*,(1999), 133–136.

Leskela, M., et al., "ALD precursor chemistry: Evolution and future challenges", *J. Phys. IV Phys. IV France, 9*,(1999),837–852.

Liu, C. T., "Circuit Requirement and Integration Challenges of Thin Gate Dielectrics for Ultra Small MOSFETs", *IEDM*, (1998),747–750.

Liu, Y. C., et al., "Growth of ultrathin SiO2 on Si by surface irradiation with an O2+Ar electron cyclotron resonance microwave plasma at low temperatures", *Journal of Applied Physics*,(Feb. 1999),pp. 1911–1915.

Lucovsky, G., et al., "Microscopic model for enhanced dielectric constants in low concentration SiO2–rich noncrystalline Zr and Hf silcate alloys", *Applied Physics Letters*, (Oct. 2000),2912–2914.

Luo, Z. J., et al., "Ultra–thin ZrO2 (or Silicate) with High Thermal Stability for CMOS GAte Applications", *2001 Symposium on VLSI Technology Digest of Technical Papers*, (2001),135–136.

Martin, P. J., et al., "Ion–beam–assisted deposition of thin films", *Applied Optics*,(Jan. 1983),pp. 178–184.

Molodyk, A. A., et al., "Volatile Surfactant–Assisted MOCVD: Application to LaAl03 Thin Film Growth", *Chem. Vap. Deposition vol. 6, No. 3*,(2000),133–138.

Molsa, Heini, et al., "Growth of Yttrium Oxide Thin Films from B–Diketonate Precusors", *Advanced Materials for Optics and Electronics*,(1994),389–400.

Muller, D. A., "The Electronic Structure at the Atomic Scale of Ultrathin Gate Oxides", *Nature, 399*,(Jun. 1999),758–761.

Nakagawara, Osamu, et al., "Electrical properties of (Zr, Sn)TiO4 dielectric thin film prepared by pulsed laser deposition", *J. Appl. Phys., 80(1)*,(Jul. 1996),388–392.

Nakajima, Anri, et al., "Atomic–layer deposition of ZrO/sub 2/ with a Si nitride barrier layer", *Applied Physics Letters, vol. 81, No. 15*,(Oct. 2002),2824–2826.

Nakajima, Anri, et al., "NH3–annealed atomic–layer–deposited silicon nitride as a high–k gate dielectric with high reliability", *Applied Physics Letters*,(Feb. 2002),1252–1254.

Neumayer, D. A., et al., "Materials characterization of ZrO2–SiO2 and HfO2–SiO2 binary oxides deposited by chemical solution deposition", *Journal of Applied Physics*, (Aug. 2001),1801–1808.

Nieminen, Minna, et al., "Formation and stability of lanthanum oxide thin films deposited from B–diketonate precursor", *Applied Surface Science*,(2001),pp. 155–165.

Nilisk, A., et al., "Atomic–scale optical monitoring of the initial growth of TiO2 thin films", *Int. Soc. Opt. Eng., 431*,(2001),72–77.

Oates, D. E., et al., "Surface impedance measurements of YBa/sub 2/Cu/sub3/O/sub 7–x/ thin films in stripline resonators", *IEEE Transactions on Magnetics, vol. 27, No. 2, pt. 2*,(Mar. 1991),867–871.

Oh, C. B., et al., *Technical Digest of International Electron Devices Meeting 2002*,(2002),423–426.

Ohring, Milton, "The Materials Science of Thin Films", *Academic Press Inc.*,(1992),118–121,125.

Osten, H. J., et al., "High–k Gate Dielectrics with Ultra–low Leakage Current Based on Praseodymium Oxide", *Technical Digest of IEDM*,(2000),653–656.

Pan, Tung M., et al., "High Quality Ultrathin CoTiO3 High–k Gate Dielectrics", *Electrochemical and Solid–State Letters*,(2000),pp. 433–434.

Pan, Tung M., et al., "High–k cobalt–titanium oxide dielectrics formed by oxidation of sputtered Co/Ti or Ti/Co films", *Applied Physics Letters*,(Mar. 2001),pp. 1439–1441.

Park, J. J., et al., *J. of the Electrochemical Soc., 149*,(2002), G89–G94.

Park, Byung–Eun, et al., "Electrical properties of LaAlO3/Si and SrO.8Bi2.2O9/LaAlO3/Si structures", *Applied Physics Letters, vol. 79, No. 6*,(Aug. 2001),806–808.

Perkins, Charles M., et al., "Electrical and materials properties of ZrO2 gate dielectrics grown by atomic layer chemical vapor deposition", *Applied Physics Letters, vol. 78, No. 16*,(Apr. 2001),2357–2359.

Poveshchenko, V. P., et al., et al., *Sov. J. Opt. Technol., 51*,(1984),277–279.

Qi, Wen–Jie, et al., "MOSCAP and MOSFET characteristics using ZrO2 gate dielectric deposited directly on Si", *IEDM Technical Digest*,(1999),145–148.

Qi, Wen–Jie, et al., "Performance of MOSFETs with ultra thin ZrO2 and Zr–silicate gate dielectrics", *IEE*,(2000),pp. 40–41.

Ramakrishnan, E. S., et al., "Dielectric Properties of Radio Frequency Magnetron Sputter Deposited Zirconium Titanate–Based Thin Films", *J. Electrochem. Soc., vol. 145, No. 1*,(Jan. 1998),358–362.

Rayner Jr., G, et al., "The Structure of Plasma–Deposited and Annealed Pseudo–Binary ZrO2–SiO2 Alloys", *Material Res. Soc. Symp.*,(2000),C1.3.1–C1.3.9.

Ritala, Mikko, "Atomic Layer Epitaxy Growth of Titanium, Zirconium and Hafnium Dioxide Thin Films", *Annales Academiae Scientiarum Fennicae*,(1994),24–25.

Ritala, Mikko, et al., "Zirconium dioxide thin fims deposited by ALE using zirconium tetrachloride as precursor", *Applied Surface Science, vol. 75*,(1994),333–340.

Robertson, J., "Band offsets of wide–band–gap oxides and implications for future electronic devices", *Journal Vac. Sci. Technol. B, 18(3)*,(2000),pp. 1785–1791.

Rossnagel, S. M., et al., "Plasma–enhanced atomic layer deposition of Ta and Ti for Interconnect diffusion barriers", *J. Vac. Sci. & Techno., B, 18*,(2000),2016–2020.

Rotondaro, A. L., et al., "Advanced CMOS Transistors with a Novel HfSiON Gate Dielectric", *Symposium on VSLI Technology Digest of Technical Papers*,(2002),148–149.

Saito, Yuji, et al., "Advantage of Radical Oxidation for Improving Reliability of Ultra–Thin Gate Oxide", *2000 Symposium on VLSI Technology Digest of Technical Papers*, (2000),176–177.

Saito, Yuji, et al., "High–Integrity Silicon Oxide Grown at Low–Temperature by Aotmic Oxygen Generated in High–Density Krypton Plasma", *Extended Abstracts of the 1999 International Conference on Solid State Devices and Materials*,(1999),152–153.

Shanware, A, et al., "Reliability evaluation of HfSION gate dielectric film with 12.8 A SiO2 equivant thickness", *International Electron Devices Meeting*,(2001),137–140.

Shin, Chang H., et al., "Fabrication and Characterization of MFISFET using Al2O3 Insulating Layer for Non–Volatile Memory", *12th International Symposium in Integrated Ferroelectrics*,(Mar. 2000),1–9.

Sneh, Ofer, "Thin film atomic layer deposition equipment for semiconductor processing", *Thin Solid Films, vol.402, No. 1–2*,(Jan. 2002),248–261.

Song, Hyun–Jung, et al., "Atomic Layer Deposition of Ta2O5 films Using Ta(OCSH5)5 and NHs", *Mat. Res. Soc. Symp. Proc.*,(1999),469–471.

Suntola, T., "Atomic Layer Epitaxy", *Handbook of Crystal Growth, 3: Thin Films of Epitaxy, Part B: Growth Mechanics and Dynamics*,Amsterdam,(1994),pp. 602–663.

Suntola, T., "Atomic layer epitaxy", *Thin Solid Films, 216*,(1992),84–89.

Sze, S. M., *Physics of Semiconductor Devices*,(1981),p. 431.

Sze, S. M., *Physics of Semiconductor Devices*,(1981),p. 473.

Takemoto, J. H., et al., "Microstrip Resonators and Filters Using High–TC Superconducting Thin Films on LaAlO3", *IEEE Transaction on Magnetics, vol. 27, No. 2*,(Mar. 1991), 2549–2552.

Tarre, A., et al., "Comparative study of low–temperature chloride atomic–layer chemical vapor deposition of TiO2 and SnO2", *Applied Surface Science*,(2001),111–116.

Tavel, B., et al., *Technical Digest of International Electron Devices Meetings 2002*,(2002),429–432.

Van Dover, R. B., et al., "Amorphous lanthanide–doped TiOx dielectric films", *Applied Physics Letters*,vol. 74, No. 20(May 17, 1999),pp. 3041–3043.

Van Dover, Robert B., et al., "Deposition of Uniform Zr–Sn–Ti–O films by ON–Axis Reactive Sputtering", *IEEE Electron Device Letters, vol. 19, No. 9*,(Sep. 1998),329–331.

Van Dover, R. B., et al., "Discovery of a useful thin–film dielectric using a composition–spread approach", *Letters to Nature*,(1997),3 pages.

Virola, H., et al., "Controlled growth of antimony–doped tin dioxide thin films by atomic layer epitaxy", *Thin Solid Films*,(1994),127–135.

Vilrola, H., "Controlled growth of tin oxide thin fims by atomic layer epitaxy", *Thin Solid Films*,(1994),144–149.

Visokay, M. R., et al., "Application of HfSiON as a gate dielectric materials", *Applied Physics Letters*,(Apr. 2002), 3183–3185.

Von Dover, R. B., et al., "Deposition of Uniform Zr–Sn–Ti–O Films by On–Axis Reactive Sputtering", *IEEE Electron Device Letters, 19*,(1998),1998.

Wilk, G. D., et al., "Hafnium and zirconium silicates for advanced gate dielectrics", *Journal of Applied Physics*,(Jan. 2000),484–492.

Wilk, G. D., et al., "High–K gate dielectrics: Current status and materials properties considerations", *J. Appl. Phys., vol. 89, No. 10*,(May 2001),5243–5275.

Wolf, Stanley, et al., "Silicon Processing for the VLSI Era – vol. I: Process Technology", *Second Edition, Lattice Press, Sunset Beach, California*,(2000),page 443.

Wolfman G. et al., "Existance range, Structural and dielectric properties of ZrxTiySnzO4 ceramics (x +y =2)", *Mat. Res. Bull., 16*,(1981),1455.

Yamaguchi, Takeshi, et al., "Band Diagram and Carrier Conduction Mechanism in ZrO2/Zr–silicates/Si MIS Structure Fabricated by Pulsed–laser–ablation Deposition", *IEDM*,(2000),19–22.

Yamaguchi, Takeshi, et al., "Study on Zr–Silicate Interfacial Layer of ZrO2–MIS Structure FAbicated by Pulsed Laser Ablation Deposition Method", *Soild State Devices and Materials*,(2000),228–229.

Zhang, H., "Atomic Layer Deposition of High Dieletric Constant Nanolaminates", *Journal of The Electrochemical Society*,148(4),(Apr. 2001),F63–F66.

Zhang, H., et al., "High permittivity thin nanolaminates", *Journal of Applied Physics, vol. 87, No. 4*,(Feb. 2000), 1921–1924.

Zhu, W. et al., "HfO2 and HfAlO for CMOS: Thermal Stability and Current Tranport", *IEEE International Electron Device Meeting 2001*,(2001),463–466.

Zucker, O., et al., "Application of Oxygen Plasma Processing to Silicon Direct Bonding", *Sensors and Actuators A, 36*,(1993),227–231.

Pein, H. B., et al., "Performance of the 3–D Sidewall Flash EPROM Cell", *IEEE International Electron Devices Meeting, Technical Digest*,(1993),11–14.

Rahtu, Antti, et al., "Atomic Layer Deposition of Zirconium Titanium Oxide from Titanium Isopropoxide and Zirconium Chloride", *Chemistry of Materials, 13(5)*,(May 2001),1528–1532.

Ramm, J., et al., "Hydrogen cleaning of silicon wafers, Investigation of the wafer surface after plasma treatment", *Thin Solid Films, 228*,(1993),23–26.

Ramo, S., et al., *Fields and Waves in Communication Electronics, Third Edition*,John Wiley & Sons, Inc.,(1994), pp. 428–433.

Rao, K. V., et al., "Trench Capacitor Design Issues in VLSI DRAM Cells", *1986 IEEE International Electron Devices Meeting, Technical Digest*,Los Angeles, CA,(Dec. 7–10, 1986),140–143.

Richardson, W. F., et al., "Trench Transistor Cross–Point DRAM Cell", *International Electron Devices Meeting*, Washington, D.C.,(Dec. 1–4, 1985),714–717.

Sagara, K., et al., "A 0.72 micro–meter2 Recessed STC (RSTC) Technology for 256Mbit DRAMs using Quarter–Mircon Phase–Shift Lithography", *1992 Symposium on VLSI Technology, Digest of Technical Papers*,Seattle, WA,(Jun. 2–4, 1992),10–11.

Seevinck, E., et al., "Current–Mode Techniques for High–Speed VLSI Circuits with Application to Current Sense Amplifier for CMOS SRAM's ", *IEEE Journal of Solid State Circuits, 26(4)*,(Apr. 1991),pp. 525–536.

Senthinathan, R., et al., "Reference Plane Parasitics Modeling and Their Contribution to the Power and Ground Path "Effective"Inductance as Seen by the Output Drivers", *IEEE Transactions on Microwave Theory and Techniques, 42*,(Sep. 1994),1765–1773.

Shah, A.H., el., "A 4–Mbit DRAM with Trench–Transistor Cell", *IEEE Journal of Solid–State Circuits, SC–21*,(Oct. 1986),618–625.

Shah, A.H., et al., "A 4Mb DRAM with Cross–Point Trench Transistor Cell", *1986 IEEE International Solid–State Circuits Conference, Digest of Technical Papers*,(Feb. 21, 1986),268–269.

Sherony, M.J., et al., "Reduction of Threshold Voltage Sensitivity in SOI MOSFET's", *IEEE Electron Device Letters, 16*,(Mar. 1995),100–102.

Shimbo, M., et al., "Silicon–to–Silicon direct bonding method", *J. Appl. Phys. vol. 60, No. 8*,(Oct. 1986),2987–2989.

Shimomura, K., et al., "A 1V 46ns 16Mb SOI–DRAM with Body Control Technique", *1997 IEEE International Solid–State Circuits Conference, Digest of Technical Papers*,(Feb. 6, 1997),68–69.

Stanisic, B.R., et al., "Addressing Noise Decoupling in Mixed–Signal IC's: Power Distribution Design and Cell Customization", *IEEE Journal of Solid–State Circuits, 30*,(Mar. 1995),321–326.

Stellwag, T.B., et al., "A Vertically–Integrated GaAs Bipolar DRAM Cell", *IEEE Transactions on Electron Devices, 38*,(Dec. 1991),2704–2705.

Harada, M., et al., "Suppression of Threshold Voltage Variation in MTCMOS/SIMOX Circuit Operating Below 0.5 V", *1996 Symposium on VLSI Technology, Digest of Technical Papers*,Honolulu, HI,(Jun. 11–13, 1996),96–97.

Harendt, Christine, "Silicon on Insulator Material by Wafer Bonding", *Journal of Electronic Materials, 20(3)*,(Mar. 1991),267–77.

Hayashi, H., et al., "Fabrication of Low–temperature bottom–gate Poly–Si TFTs on large–area substrate by linear–beam excimer laser crystallization and ion doping method", *IEEE IEDM, vol. 95*,(1995),829–832.

Heavens, O., *Optical Properties of Thin Solid Films*,Dover Pubs, Inc., New York,(1965),155–206.

Hisamoto, D., et al., "A New Stacked Cell Structure Cell Structure for Giga–Bit DRAMs using Vertical Ultra–Thin SOI (DELTA) MOSFETs", *1991 IEEE International Electron Devices Meeting, Technical Digest*,Washington, D.C., (Dec. 8–11, 1991),959–961.

Hodges, David A., et al., "MOS Decoders", *In: Analysis and Design of Digital Integrated Circuits, 2nd Edition*,Section: 9.1.3,(1988),354–357.

Holman, W.T., et al., "A Compact Low Noise Operational Amplifer for a 1.2 Micrometer Digital CMOS Technology", *IEEE Journal of Solid–State Circuits, 30*,(Jun. 1995),710–714.

Horiuchi, M., et al., "A mechanism of silicon wafer bonding", *of the First International Symposium on Semiconductor Wafer Bonding: Science, Technology and Applications,* (1992),48–62.

Hu, G., et al., "Will Flash Memory Replace Hard Disk Drive?", *1994 IEEE International Electron Device Meeting*, Panel Discussion, Session 24, Outline,(Dec. 1994),2 pages.

Huang, W.L., et al., "TFSOI Complementary BicMOS Technology for Low Power Applications", *IEEE Transactions on Electron Devices, 42*,(Mar. 1995),506–512.

Imthurn, "Bonded Silicon–on–Sapphire Wafers and Devices", *Journal of Applied Physics, 72(6)*,(Sep. 1992), 2526–7.

Jun, Y.K. et al., "The Fabrication and Electrical Properties of Modulated Stacked Capacitor for Advanced for Advanced DRAM Applications", *IEEE Electron Device Letters, 13*,(Aug. 1992),430–432.

Jung, T.S., et al., "A 117–mm2 3.3–V Only 128–Mb Multilevel NAND Flash Memory for Mass Storage Applications", *IEEE Journal of Solid–State Circuits, 31*,(Nov. 1996),1575–1583.

Kang, H.K., et al., "Highly Manufacturable Process Technology for Reliable 256 Mbit and 1Gbit DRAMS", *IEEE International Electron Devices Meeting, Technical Digest*, San Francisco, CA,(Dec. 11–14, 1994),635–638.

Kim, Y.S., "A Study on Pyrolysis DMEAA for Selective Deposition of Aluminum", *In: Advanced Metallization and Interconnect Systems for ULSI Applications in 1995*,R.C. Ellwanger, et al., (eds.), Materials Research Society, Pittsburgh, PA,(1996),675–680.

\* cited by examiner

METHODS FOR ATOMIC-LAYER DEPOSITION OF ALUMINUM OXIDES IN INTEGRATED CIRCUITS

TECHNICAL FIELD

This invention concerns methods of making integrated circuits, particularly layer formation techniques, such as chemical-vapor deposition and atomic-layer deposition.

BACKGROUND OF INVENTION

Integrated circuits, the key components in thousands of electronic and computer products, are interconnected networks of electrical components fabricated on a common foundation, or substrate. Fabricators generally build these circuits layer by layer, using techniques, such as deposition, doping, masking, and etching, to form and interconnect thousands and even millions of microscopic transistors, resistors, and other electrical components on a silicon substrate, known as a wafer.

One common technique for forming layers in an integrated circuit is called chemical vapor deposition. Chemical vapor deposition generally entails placing a substrate in a reaction chamber, heating the substrate to prescribed temperatures, and introducing one or more gases, known as precursor gases, into the chamber to begin a deposition cycle. The precursor gases enter the chamber through a gas-distribution fixture, such as a gas ring or a showerhead, one or more centimeters above the substrate, and descend toward the heated substrate. The gases react with each other and/or the heated substrate, blanketing its surface with a layer of material. An exhaust system then pumps gaseous by-products or leftovers from the reaction out of the chamber through a separate outlet to complete the deposition cycle.

Conventional chemical-vapor-deposition (CVD) systems suffer from at least two problems. First, conventional CVD systems generally form non-uniformly thick layers that include microscopic hills and valleys, and thus generally require use of post-deposition planarization or other compensation techniques. Second, it is difficult, if not impossible, for CVD to provide uniform coverage of trench sidewalls or complete filling of holes and trenches.

To address these shortcomings, fabricators have developed atomic-layer deposition (ALD), a special form of CVD that allows highly uniform formation of ultra-thin layers having thicknesses of one molecule or several atoms of the deposited material. Though similar to CVD in terms of equipment and process flow, ALD relies on adsorption of some of the reactants into exposed surfaces, and thus provides coverage and fill of structural features that are difficult, if not impossible, using CVD.

In recent years, researchers and engineers have made strides toward making ALD commercially viable for some applications. For example, one team of researchers reportedly optimized an ALD process for depositing an aluminum oxide ($AlO_x$) film in thin-film heads—devices used to read and write magnetic data. See, Paranjpe et al., Atomic Layer Deposition of $AlO_x$ for Thin Film Head Gap Applications, Journal of Electrochemical Society, 148 (9), pp. G465–G471 (2001), which is incorporated herein by reference.

However, the present inventors have recognized that the equipment and processes reported as optimal for thin-film head applications suffer from some limitations relative to use in fabricating integrated circuits. For example, the reported process deposits material at the slow rate of less than one Angstrom per cycle, suggesting that more than 50 cycles would be necessary to form a 50-Angstrom-thick layer. Moreover, the reported equipment uses a larger than desirable reaction chamber, which takes longer to fill up or pump out, and thus prolongs the duration of each deposition cycle.

Accordingly, there is a need for better systems and methods of atomic-layer deposition of aluminum oxides as well as other material compositions.

SUMMARY OF SELECTED EMBODIMENT(S)

To address these and/or other problems, the present inventor devised new systems, methods, and apparatuses for atomic layer deposition. One exemplary atomic-layer deposition system, well suited for aluminum-oxide depositions in integrated-circuit fabrication, includes an outer chamber, a substrate holder, and a unique gas-distribution fixture. The fixture includes a gas-distribution surface having two sets of holes and a gas-confinement member that forms a wall around the holes. In operation, one set of holes dispenses an aluminum-carrying precursor and the other dispenses an oxidizing agent gas, after the gas-confinement member engages, or otherwise cooperates with the substrate holder to form an inner chamber within the outer chamber.

The inner chamber has a smaller volume than the outer chamber and thus consumes less gas during the deposition process than would the outer chamber used alone. Also, the smaller chamber volume allows the exhaust system to pump the chamber more quickly, thus allowing shorter ALD cycles and potentially increasing rates of production.

These and other embodiments, aspects, advantages, and features of the present invention are set forth in part in the description and claims which follow, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE EXEMPLARY EMBODIMENTS

The following detailed description, which references and incorporates the above-identified figures, describes and illustrates one or more specific embodiments of the invention. These embodiments, offered not to limit but only to exemplify and teach the invention, are shown and described in sufficient detail to enable those skilled in the art to make and use the invention. Thus, where appropriate to avoid obscuring the invention, the description may omit certain information known to those of skill in the art.

Figure 1:
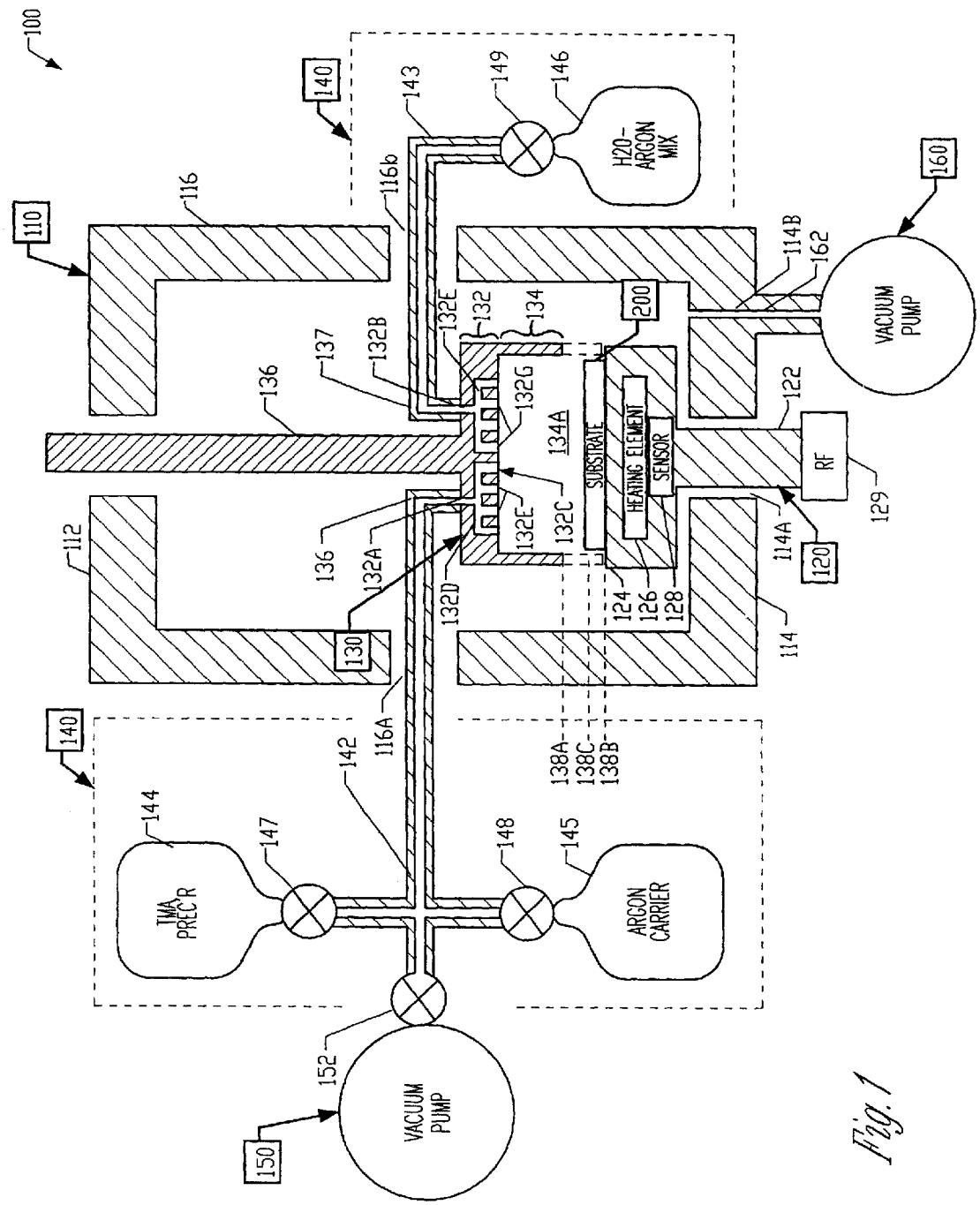
FIG. 1 is a side view of an exemplary deposition reactor according to the invention.

FIG. 1 shows an exemplary atomic-layer-deposition system 100 which incorporates teachings of the present invention. In particular, system 100 includes a chamber 110, a wafer holder 120, a gas-distribution fixture (or showerhead) 130, a gas-supply system 140, and exhaust pumps 150 and 160.

More particularly, chamber 110 includes respective top and bottom plates 112 and 114 and a sidewall 116. In the exemplary embodiment, chamber 110 is a cylindrical structure formed of stainless steel or glass. However, other embodiments use different structures and materials. Bottom plate 114 includes an opening 114A. Extending through opening 114A is a stem portion 122 of wafer holder 120.

Wafer holder 120 also includes a support platform 124, one or more heating elements 126, one or more temperature sensors 128, and an RF source 129. Holder 120 (also called a chuck) raises and rotates manually or automatically via lift and rotation devices, and is coupled to a power supply and temperature control circuitry (all of which are not shown). Support platform 124 supports one or more substrates, wafers, or integrated-circuit assemblies 200. Substrate 200 has an exemplary width or diameter of about 30 centimeters and an exemplary thickness in the range of 850–1000 microns. (The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.)

Heating elements 126 and temperature sensors 128 are used for heating substrates 200 to a desired temperature. Radio Frequency (RF) source 129, for example, a 1.25-kilowatt-13.56-megahertz RF generator, is used to generate and sustain a capacitively coupled plasma between the wafer holder and gas-distribution fixture 130. (Some embodiments use generators with smaller or larger capacities.) Fixture 130, positioned above wafer holder 120 and substrate 200, includes a gas-distribution member 132, a surface-projection (or gas-confinement) member 134, and gas inlets 136 and 137. In the exemplary embodiment, fixture 130 has three operating positions 138A, 138B, and 138C relative support platform 124. Fixture 130 takes operating position 138A, before and after depositions and operating position 138B during depositions. Position 138C is taken during a plasma anneal to ensure stability of the plasma.

Gas-distribution member 132 includes main gas inputs 132A and 132B, gas-distribution channels 132D and 132F, and gas-distribution holes 132E and 132G. Main gas inputs 132A and 132B feed respective gas-distribution channels 132D and 132F, which in turn feed respective gas-distribution holes 132E and 132G. (Holes 132E and 132G are actually interleaved in the exemplary embodiment, though shown simply in the figure as spatially segregated groups.) Holes 132D and 132F define a gas-distribution surface 132C.

In the exemplary embodiment, holes 132D and 132F are substantially circular with a common diameter in the range of 15–20 microns; gas-distribution channels 132D and 132F have a common width in the range of 20–45 microns; and surface 132C is substantially planar and parallel to platform 124 of wafer holder 120. However, other embodiments use other surface forms as well as shapes and sizes of holes and channels.

Extending from gas-distribution surface 132C is surface-projection member (or collar) 134. Member 134 projects or extends from surface 132C toward support platform 124, defining a fixture cavity 134A. The exemplary embodiment forms surface-projection member 134 from stainless steel as a uniform annular or circular wall or collar that projects perpendicularly from surface 132C to define a right-cylindrical cavity.

However, other embodiments form member 134 to project at other angles relative surface 132C. For example, some form the projection at an acute or obtuse angle, such as 45 or 135 degrees, and others form the projection to peripherally define an oval, ellipse, triangle, square, or any desirable regular or irregular polygon. Thus, the present invention encompasses a wide variety of projection shapes and configurations, indeed any projection shape that facilitates definition of an effective cavity or gas-confinement volume in cooperation with wafer holder 120 and/or substrate 200.

Figure 2:
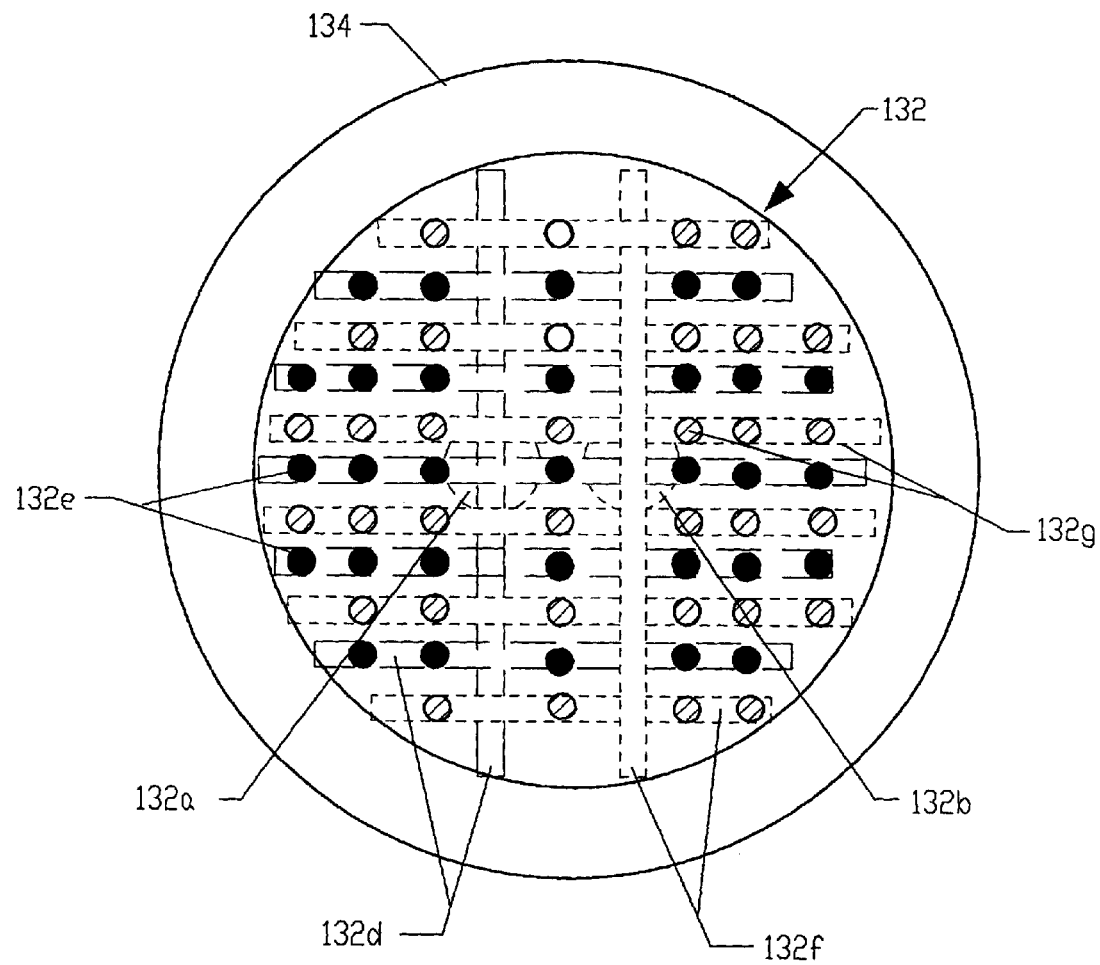
FIG. 2 is a plan view of an exemplary gas-distribution fixture according to the invention.

FIG. 2, a plan view, shows further details of the exemplary embodiment of gas-distribution fixture 130. In particular, the plan view shows not only exemplary circular peripheries of gas-distribution member 132 and surface-projection member 134, but also an exemplary interleaved distribution pattern for holes 132E and 132G, and an exemplary orthogonal arrangement of gas-distribution channels 132D and 132F. (Holes 132E are shown darkly shaded to distinguish them from holes 132G, which are cross-hatched.)

Other embodiments use other hole distribution patterns and channel arrangements. For example, some embodiments include random or concentric hole patterns and various channel geometries, including concentric circles, rectangles, or other regular or irregular concentric polygons. Some embodiments may also dedicate various subsets of channels and corresponding holes to different gases. For example, one embodiment provides one set of holes and channels for approximately uniform distribution of a gas or vapor, such as TMA precursor and argon carrier gas mixture, and another set of holes and channels for approximately uniform distribution of a gas or vapor, such as a water-argon mixture.

Gas-distribution member 132 can be made in a number of ways. One exemplary method entails laminating several material layers, with each layer including holes and/or channels to effect distribution of the gases to the separate holes. If the layers are made of silicon, the material layers can be patterned and etched, for example, using conventional photolithographic or micro-electromechanical systems (MEMS) technology, to form holes and channels. Dry-etching techniques produce small openings and channels, while wet etching produces larger openings and channels. For further details, see, for example, M. Engelhardt, "Modern Application of Plasma Etching and Patterning in Silicon Process Technology, " Contrib. Plasma Physics, vol. 39, no. 5, pp. 473–478 (1999). Also see co-pending and co-assigned U.S. patent application Ser. No. 09/797,324 which was filed on Mar. 1, 2001, now U.S. Pat. No. 6,852,167, and which is incorporated herein by reference.

The processed layers can then be bonded together with the holes and channels in appropriate alignment using known wafer-bonding techniques. See, for example, G. Krauter et al., "Room Temperature Silicon Wafer Bonding with Ultra-Thin Polymer Films," Advanced Materials, vol. 9, no. 5, pp. 417–420 (1997); C. E. Hunt et al., "Direct Bonding of Micromachined Silicon Wafers for Laser Diode Heat Exchanger Applications, " Journal of Micromechan. Microeng. vol. 1, pp. 152–156 (1991); Zucker, O. et al., "Applications of oxygen plasma processing to silicon direct bonding," Sensors and Actuators, A. Physical, vol. 36, no. 3, pp. 227–231 (1993), which are all incorporated herein by reference. See also, co-pending and co- assigned U.S. patent application Ser. No. 09/189,276 entitled "Low Temperature Silicon Wafer Bond Process with Bulk Material Bond Strength," which was filed Nov. 10, 1998, now U.S. Pat. No. 6,423,613, and which is also incorporated herein by reference. The resulting bonded structure is then passivated using thermal oxidation for example.

For an alternative fixture structure and manufacturing method that can be combined with those of the exemplary embodiment, see U.S. Pat. No. 5,595,606, entitled "Shower Head and Film Forming Apparatus Using Same, which is incorporated herein by reference. In particular, one embodiment based on this patent adds a projection or gas-confinement member to the reported showerhead structure.

FIG. 1 also shows that gas inlets 136 and 137, which feed respective holes 132E and 132G, are coupled to gas-supply system 140. Specifically, gas-supply system 140 includes gas lines 142 and 143, gas sources 144, 145, and 146, and manual or automated mass-flow controllers 147, 148, and 149. Gas line or conduit 142, which includes one or more flexible portions (not specifically shown), passes through an opening 116A in chamber sidewall 116 to connect with gas inlet 136. Gas sources 144 and 145 are coupled respectively via mass-flow controllers 147 and 148 to gas line 142. Gas line 143, which also includes one or more flexible portions (not specifically shown), passes through an opening 116B in chamber sidewall 116 is coupled via mass-flow controller 149 to source 146.

In the exemplary embodiment, which is tailored for aluminum oxide deposition, source 144 provides a vapor-drawn aluminum precursor, such as trimethylaluminum (TMA) with a vapor pressure of 11 Torr at room temperature; source 145 provides a carrier gas, such as argon; and source 146 provides an oxidant, such as a water-argon mixture. The water-argon mixture can be implemented by bubbling an argon carrier through a water reservoir. Other embodiments use other aluminum precursors, such as trisobutylaluminum (TIBA), dimethylaluminum hydride (DMAH), $AlCl_3$, and other halogenated precursors and organometallic precursors. Other types of oxidants include $H_2O_2$, $O_2$, $O_3$, $N_2O$. Thus, the present invention is not limited to specific aluminum precursors or oxidants.

System 100 also includes vacuum pumps 150 and 160. Vacuum pump 150 is coupled to gas-distribution fixture 130 via a mass-flow controller 152 and gas line 142. And, vacuum pump 160 is coupled to the interior of chamber 110 via a line 162 and an opening 114B in chamber bottom plate 114.

In general operation, system 100 functions, via manual or automatic control, to move gas-distribution fixture 130 from operating position 138A to position 138B, to introduce reactant gases from sources 145, 146, and 147 through holes 132E and 132G in gas-distribution fixture 130 onto substrate 200, and to deposit desired matter, such as an aluminum oxide, onto a substrate.

Figure 3:
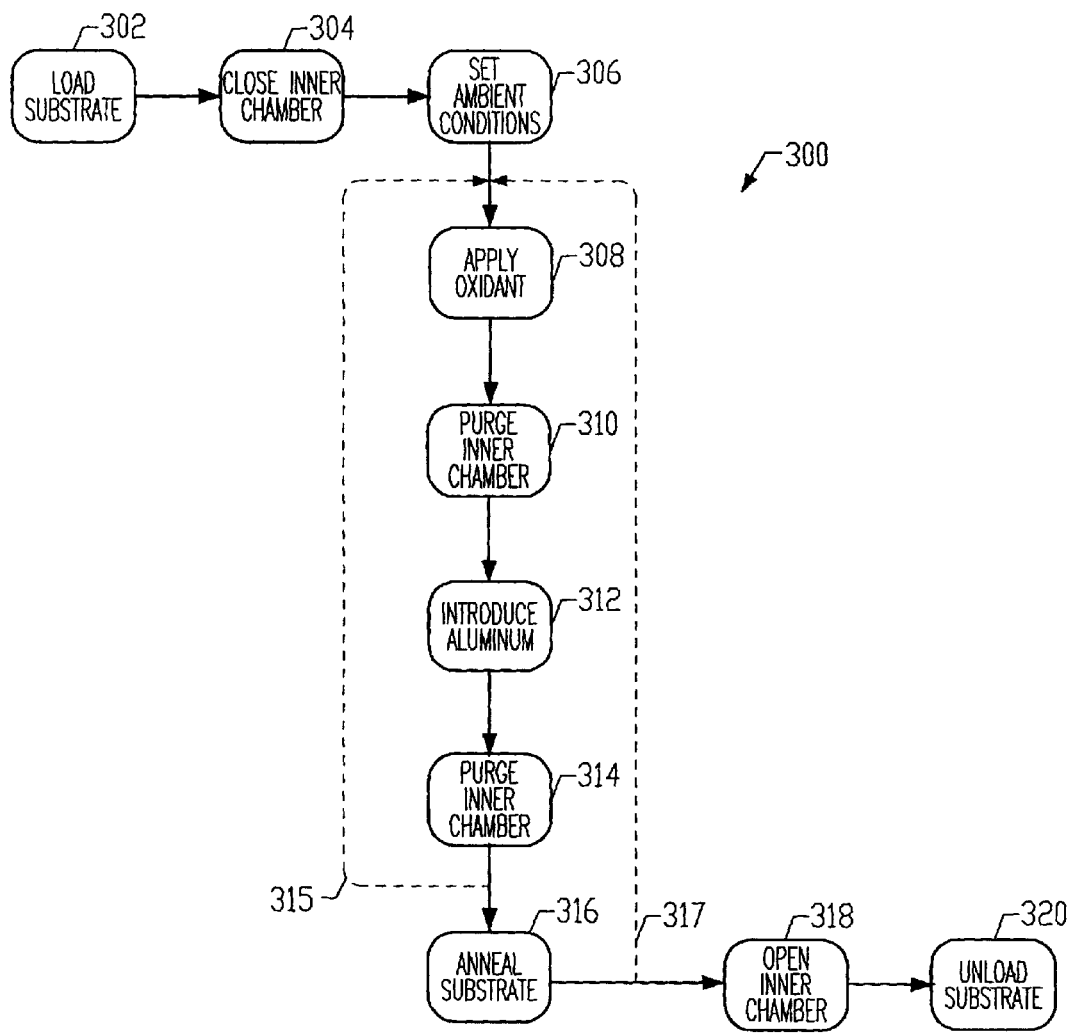
FIG. 3 is a flowchart showing an exemplary method according to the invention.

More particularly, FIG. 3 shows a flowchart 300 which illustrates an exemplary method of operating system 100. Flowchart 300 includes process blocks 302–320.

The exemplary method begins at block 302 with insertion of substrate 200 onto wafer holder 120. Execution then proceeds to block 304.

In block 304, the system forms or closes an inner chamber around substrate 200, or at least a portion of substrate 200 targeted for deposition. In the exemplary embodiment, this entails using a lever or other actuation mechanism (not shown) to move gas-distribution fixture 130 from position 138A to position 138B or to move wafer holder 120 from position 138B to 138A. In either case, this movement places gas-distribution surface 132C 10–20 millimeters from an upper most surface of substrate 200. In this exemplary position, a lower-most surface of surface-projection member 134 contacts the upper surface of support platform 124, with the inner chamber bounded by gas-distribution surface 132C, surface-projection member 134, and the upper surface of support platform 124.

Other embodiments define the inner chamber in other ways. For example, some embodiments include a surface-projection member on support platform 124 of wafer holder 120 to define a cavity analogous in structure and/or function to cavity 134A. In these embodiments, the surface-projection member takes the form of a vertical or slanted or curved wall, that extends from support platform 124 and completely around substrate 200, and the gas-distribution fixture omits a surface-projection member. However, some embodiments include one or more surface-projection members on the gas-distribution fixture and the on the support platform, with the projection members on the fixture mating, engaging, or otherwise cooperating with those on the support platform to define a substantially or effectively closed chamber. In other words, the inner chamber need not be completely closed, but only sufficiently closed to facilitate a desired deposition.

In block 306, after forming the inner chamber, the exemplary method continues by establishing desired ambient conditions for the desired deposition. This entails setting temperature and pressure conditions within chamber 110, including cavity 134A. To this end, the exemplary embodiment operates heating element 126 to heat substrate 200 to a desired temperature, such as 150–200° C., and operating vacuum pump 150 and/or pump 160 to establish a desired ambient pressure, such as 3.0 Torr. Gas-distribution fixture 130 is held at a temperature 30–50° C. warmer than its surroundings. (However, other embodiments can maintain the fixture at other relative operating temperatures.) After establishing the desired ambient conditions, execution continues at block 308.

Block 308 entails hydroxylating the surface of substrate 200 by introducing an oxidant into the separate chamber. To this end, the exemplary embodiment shuts mass-flow controllers 147 and 148 and operates mass-flow controller 149 to transfer an oxidant, such as a water in an argon carrier, from source 146 through gas line 143 and holes 132G into cavity 134A for a period, such as two seconds.

Notably, the inner chamber is smaller in volume than chamber 100 and thus requires less gas and less fill time to achieve desired chemical concentrations (assuming all other factors equal.) More precisely, the exemplary embodiment provides an inner chamber with an empty volume in the range of 70 to 350 cubic centimeters, based on a 1-to-5 millimeter inner-chamber height and a fixture with a 30-centimeter diameter. Additionally, the number and arrangement of holes in the fixture as well as the placement of the holes close to the substrate, for example within five millimeters of the substrate, promote normal gas incidence and uniform distribution of gases over the targeted portion of substrate 200.

Block 310 entails purging or evacuating the inner chamber to reduce water concentration in the gas-distribution fixture and inner chamber to trace levels. To this end, the exemplary method initially drives a high flow of argon gas from source 145 through fixture 130 into the inner chamber and then draws the gas out of the inner chamber through the fixture via vacuum pump 150, defining a purge cycle of less than five seconds, for example three-four seconds. The present invention, however, is not believed to be limited to any particular purge-cycle duration.

Next, as block 312 shows, the exemplary method introduces an aluminum precursor into the inner chamber through gas-distribution fixture 130. This entail operating mass-flow controllers 147 and 148 to respectively allow the flow of TMA and an argon carrier into fixture 130 via line 142 for a period of time such as 0.5–2.0 seconds. During this period, the argon carries the TMA to the hydroxylated surface of the substrate, causing formation of an approximately 0.8 Angstrom (A) monolayer of aluminum oxide ($AlO_x$).

Block 314 entails purging or evacuating the inner chamber to reduce precursor concentration in the gas-distribution fixture and inner chamber to trace levels. To this end, the exemplary method initially drives a flow of argon gas from source 145 through fixture 130 into the inner chamber and then draws the gas out of the inner chamber through the fixture via vacuum pump 150. Again, this purge cycle is expected to consume less than five seconds.

At this point, as represented by a return path 315 back to block 304, blocks 304–314 can be repeated as many times as desired to achieve an aluminum-oxide layer within roughly one Angstrom of virtually any desired thickness from 5–10 Angstroms upwards. For semiconductor applications, such as forming gate dielectrics, thicknesses in the range of 50–80 Angstroms could be used.

Block 316 entails annealing the substrate and deposited aluminum-oxide layer to enhance the dielectric breakdown voltage of the layer. In the exemplary embodiment, this entails moving fixture 130 to operating position 138C (which establishes a substrate-to-fixture separation in the range of 30–50 millimeters) and using RF source 129 to generate a 250 Watt capacitively coupled plasma at 0.12 Torr in an argon-oxygen atmosphere (10 atom percent $O_2$) between the wafer holder. Some embodiments anneal after every monolayer to maximize dielectric breakdown strength, and some anneal after each 25–50 Angstroms of deposited material thickness. Though various anneal times are feasible, the exemplary embodiment anneals for 10–15 seconds in high-temperature environment. A return path 317 back to block 304 indicates that blocks 304–316 can be repeated as many times as desired.

In block 318, the system opens the separate chamber. In the exemplary embodiment, this entails automatically or manually moving gas-distribution fixture 130 to position 138A. Other embodiments, however, move the wafer holder or both the fixture and the wafer holder. Still other embodiments may use multipart collar or gas-confinement members which are moved laterally relative the wafer holder or gas-distribution fixture to open and close an inner chamber.

In block 320, substrate 200 is unloaded from chamber 110. Some embodiments remove the substrate manually, and others remove it using an automated wafer transport system.

CONCLUSION

In furtherance of the art, the inventors have presented new systems, methods, and apparatuses for atomic-layer deposition. One exemplary system includes an outer chamber, a substrate holder, and a unique gas-distribution fixture. The fixture engages, or otherwise cooperates with the substrate holder to form an inner chamber within the outer chamber. Notably, the inner chamber not only consumes less gas during deposition to reduce deposition waste and cost, but also facilitates rapid filling and purging to reduce deposition cycle times (with all other factors being equal.)

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. A method of operating a deposition system having a gas-distribution fixture for distributing gas over a substrate, the method comprising:
   introducing an aluminum precursor into the chamber through the gas-distribution fixture; and
   purging the chamber of at least a portion of the aluminum precursor through the gas-distribution fixture.

2. The method of claim 1, wherein purging comprises operating a pump coupled to the gas-distribution fixture.

3. The method of claim 1, further comprising:
   changing relative position of the gas-distribution fixture and a substrate before introducing the aluminum precursor.

4. The method of claim 1, wherein the aluminum precursor consists essentially of trimethylaluminum, and the oxidant consist essentially of water.

5. A method of operating a deposition system, the method comprising:
   providing a first chamber including at least one substrate;
   forming a second chamber within the first chamber and substantially enclosing the one substrate;
   introducing an oxidant into the second chamber; and
   introducing an aluminum precursor into the second chamber.

6. The method of claim 5
   wherein the deposition system includes a surface supporting the one substrate and a gas-distribution fixture; and
   wherein forming the second chamber comprises reducing a distance between the gas-distribution fixture and the substrate.

7. The method of claim 5, wherein the aluminum precursor consists essentially of trimethylaluminum, and the oxidant consists essentially of water.

8. A method of operating a deposition system, the method comprising:
   loading at least one substrate into a first chamber;
   forming a second chamber around the one substrate;
   introducing an oxidant into the second chamber;
   purging the second chamber of at least a portion of the oxidant;
   introducing an aluminum precursor into the second chamber;
   purging the second chamber of at least a portion of the aluminum precursor;
   opening the second chamber; and
   unloading the one substrate from the first chamber.

9. The method of claim 8, wherein the recited acts are performed in the recited order.

10. The method of claim 8,
    wherein the deposition system includes a surface supporting the one substrate and a gas-distribution fixture; and
    wherein forming the second chamber around the one substrate comprises reducing a distance between the gas-distribution fixture and the substrate.

11. The method of claim 8, wherein the aluminum precursor consists essentially of trimethylaluminum, and the oxidant consist essentially of water.

12. A method of operating a deposition system, the method comprising:
    loading at least one substrate into a first chamber;
    forming a second chamber around the one substrate;
    introducing an oxidant into the second chamber;
    purging the second chamber of at least a portion of the oxidant;
    introducing an aluminum precursor into the second chamber;
    purging the second chamber of at least a portion of the aluminum precursor;
    opening the second chamber; and
    annealing the one substrate in the first chamber;
    unloading the one substrate from the first chamber.

13. The method of claim 12, wherein the recited acts are performed in the recited order.

14. The method of claim 12,
    wherein the deposition system includes a surface supporting the one substrate and a gas-distribution fixture; and
    wherein forming the second chamber around the one substrate comprises reducing a distance between the gas-distribution fixture and the substrate.

15. The method of claim 12, wherein the aluminum precursor consists essentially of trimethylaluminum, and the oxidant consist essentially of water.

16. A method of making a gate dielectric layer in an integrated-circuit assembly, the method comprising:
    loading the integrated-circuit assembly into a first chamber;
    forming a second chamber around the assembly;
    introducing an oxidant into the second chamber;
    purging the second chamber of at least a portion of the oxidant;
    introducing an aluminum precursor into the second chamber;
        purging the second chamber of at least a portion of the aluminum precursor;
    opening the second chamber; and
    annealing the assembly in the first chamber;
    unloading the one substrate from the first chamber.

17. The method of claim 16, wherein the recited acts are performed in the recited order.

18. The method of claim 16:
    wherein the deposition system includes a surface supporting the one substrate and a gas-distribution fixture; and
    wherein forming the second chamber around the one substrate comprises reducing a distance between the gas-distribution fixture and the substrate.

19. The method of claim 16, wherein the aluminum precursor consists essentially of trimethylaluminum, and the oxidant consist essentially of water.

* * * * *

UNITED STATES PATENT AND TRADEMARK OFFICE
CERTIFICATE OF CORRECTION

PATENT NO. : 7,160,577 B2  
APPLICATION NO. : 10/137168  
DATED : January 9, 2007  
INVENTOR(S) : Ahn et al.

It is certified that error appears in the above-identified patent and that said Letters Patent is hereby corrected as shown below:

On page 2, in Item (56), under "U.S. Patent Documents", in column 1, line 24, after "5,080,928 A" insert -- * --.

On page 2, in Item (56), under "U.S. Patent Documents", in column 1, line 32, after "5,198,029 A" insert -- * --.

On page 2, in Item (56), under "U.S. Patent Documents", in column 2, line 29, after "5,916,365 A" insert -- * --.

On page 3, in Item (56), under "U.S. Patent Documents", in column 1, line 12, after "6,444,895 B1" insert -- * --.

On page 3, in Item (56), under "U.S. Patent Documents", in column 1, line 30, delete "Nguyen" and insert -- Kaushik --, therefor.

On page 3, in Item (56), under "U.S. Patent Documents", in column 2, line 20, delete "B1" and insert -- B2 --, therefor.

On page 3, in Item (56), under "U.S. Patent Documents", in column 2, line 45, after "2002/0122885 A1" insert -- * --.

On page 4, in Item (56), under "U.S. Patent Documents", in column 1, line 70, after "Ahn" insert -- 118/715 --.

On page 4, in Item (56), under "U.S. Patent Documents", in column 2, line 2, after "Ahn" insert -- 118/715 --.

On page 5, in Item (56), under "Other Publications", in column 1, line 21, delete "La/sub 2/O/sub 0.3/Ge/sub 0.7" and insert
-- La/sub 2/O/sub 3//Si/sub 0.3/Ge/Sub 0.7 --, therefor.

On page 5, in Item (56), under "Other Publications", in column 1, line 42, delete "Tantaium" and insert -- Tantalum --, therefor.

On page 5, in Item (56), under "Other Publications", in column 2, line 2, delete "ZrO2/Ai2O3" and insert -- ZrO2/Al2O3 --, therefor.

On page 5, in Item (56), under "Other Publications", in column 2, line 4, delete "(81)" and insert -- (18) --, therefor.

UNITED STATES PATENT AND TRADEMARK OFFICE
CERTIFICATE OF CORRECTION

PATENT NO.        : 7,160,577 B2
APPLICATION NO.   : 10/137168
DATED             : January 9, 2007
INVENTOR(S)       : Ahn et al.

It is certified that error appears in the above-identified patent and that said Letters Patent is hereby corrected as shown below:

On page 5, in Item (56), under "Other Publications", in column 2, line 22, delete "Cooper" and insert -- Copper --, therefor.

On page 5, in Item (56), under "Other Publications", in column 2, line 32, delete "nitrded" and insert -- nitrided --, therefor.

On page 5, in Item (56), under "Other Publications", in column 2, line 37, delete "Cooper" and insert -- Copper --, therefor.

On page 5, in Item (56), under "Other Publications", in column 2, line 52, delete "Cooper" and insert -- Copper --, therefor.

On page 5, in Item (56), under "Other Publications", in column 2, line 55, delete "Ziroconium" and insert -- Zirconium --, therefor.

On page 6, in Item (56), under "Other Publications", in column 1, line 31, delete "Cicuits" and insert -- Circuits --, therefor.

On page 6, in Item (56), under "Other Publications", in column 2, line 38, delete "Al2O3" and insert -- Al2O3 --, therefor.

On page 6, in Item (56), under "Other Publications", in column 2, line 38, before "layer" delete "by atomic".

On page 6, in Item (56), under "Other Publications", in column 2, line 48, delete "Photoluminescene" and insert -- Photoluminescence --, therefor.

On page 6, in field (56), under "Other Publications", in column 2, line 52, delete "Multigigia" and insert -- Multigiga --, therefor.

On page 7, in Item (56), under "Other Publications", in column 1, line 33, delete "Thining" and insert -- Thinning --, therefor.

On page 7, in Item (56), under "Other Publications", in column 1, line 37, delete "SIO" and insert -- SiO --, therefor.

On page 7, in Item (56), under "Other Publications", in column 1, line 41, delete "MOSFFET's" and insert -- MOSFET's --, therefor.

UNITED STATES PATENT AND TRADEMARK OFFICE
CERTIFICATE OF CORRECTION

PATENT NO. : 7,160,577 B2
APPLICATION NO. : 10/137168
DATED : January 9, 2007
INVENTOR(S) : Ahn et al.

It is certified that error appears in the above-identified patent and that said Letters Patent is hereby corrected as shown below:

On page 7, in Item (56), under "Other Publications", in column 1, line 47, delete "Surronding" and insert -- Surrounding --, therefor.

On page 7, in Item (56), under "Other Publications", in column 1, line 50, delete "Evalution" and insert -- Evaluation --, therefor.

On page 7, in Item (56), under "Other Publications", in column 2, line 6, delete "Simualtion" and insert -- Simulation --, therefor.

On page 7, in Item (56), under "Other Publications", in column 2, line 23, delete "Intregrated" and insert -- Integrated --, therefor.

On page 8, in Item (56), under "Other Publications", in column 1, line 43, delete "Siliocn" and insert -- Silicon --, therefor.

On page 8, in Item (56), under "Other Publications", in column 1, line 45, delete "Vaccuum" and insert -- Vacuum --, therefor.

On page 8, in Item (56), under "Other Publications", in column 2, line 34, delete "Bunshahm" and insert -- Bunshah --, therefor.

On page 8, in Item (56), under "Other Publications", in column 2, line 51, delete "Miniization" and insert -- Minimization --, therefor.

On page 9, in Item (56), under "Other Publications", in column 1, line 13, delete "Crystallograhic" and insert -- Crystallographic --, therefor.

On page 9, in Item (56), under "Other Publications", in column 1, line 36, delete "Micromeng. Micromech" and insert -- Micromech. Microeng --, therefor.

On page 9, in Item (56), under "Other Publications", in column 1, line 46, delete "og" and insert -- of --, therefor.

On page 9, in Item (56), under "Other Publications", in column 2, line 5, delete "Comparsion" and insert -- Comparison --, therefor.

On page 9, in Item (56), under "Other Publications", in column 2, line 16, delete "pf" and insert -- of --, therefor.

On page 9, in Item (56), under "Other Publications", in column 2, line 23, delete "opitcal" and insert -- optical --, therefor.

UNITED STATES PATENT AND TRADEMARK OFFICE
CERTIFICATE OF CORRECTION

PATENT NO. : 7,160,577 B2
APPLICATION NO. : 10/137168
DATED : January 9, 2007
INVENTOR(S) : Ahn et al.

It is certified that error appears in the above-identified patent and that said Letters Patent is hereby corrected as shown below:

On page 9, in Item (56), under "Other Publications", in column 2, line 33, delete "72–79" and insert -- 303–310 --, therefor.

On page 9, in Item (56), under "Other Publications", in column 2, line 35, delete "Fims" and insert -- Films --, therefor.

On page 10, in Item (56), under "Other Publications", in column 1, line 10, before "France" delete "Phys. IV".

On page 10, in Item (56), under "Other Publications", in column 1, line 21, delete "silcate" and insert -- silicate --, therefor.

On page 10, in Item (56), under "Other Publications", in column 1, line 54, delete "Nilisk" and insert -- Niilisk --, therefor.

On page 10, in Item (56), under "Other Publications", in column 1, line 57, delete "impedence" and insert -- impedance --, therefor.

On page 10, in Item (56), under "Other Publications", in column 2, line 13, delete "SrO.8Bi2.2O9" and insert -- SrO.8Bi2.2Ta2O9 --, therefor.

On page 10, in Item (56), under "Other Publications", in column 2, line 25, delete "IEE" and insert -- IEEE --, therefor.

On page 10, in Item (56), under "Other Publications", in column 2, line 37, delete "fims" and insert -- films --, therefor.

On page 10, in Item (56), under "Other Publications", in column 2, line 47, delete "VSLI" and insert -- VLSI --, therefor.

On page 10, in Item (56), under "Other Publications", in column 2, line 54, delete "Aotmic" and insert -- Atomic --, therefor.

On page 10, in Item (56), under "Other Publications", in column 2, line 58, delete "HfSION" and insert -- HfSiON --, therefor.

On page 10, in Item (56), under "Other Publications", in column 2, line 59, delete "equivant" and insert -- equivalent --, therefor.

UNITED STATES PATENT AND TRADEMARK OFFICE
CERTIFICATE OF CORRECTION

PATENT NO. : 7,160,577 B2
APPLICATION NO. : 10/137168
DATED : January 9, 2007
INVENTOR(S) : Ahn et al.

It is certified that error appears in the above-identified patent and that said Letters Patent is hereby corrected as shown below:

On page 11, in Item (56), under "Other Publications", in column 1, line 5, delete "Ta(OCSH5)5 and NHs" and insert -- Ta(OC2H5)5 and NH3 --, therefor.

On page 11, in Item (56), under "Other Publications", in column 1, line 32, delete "Virola" and insert -- Viirola --, therefor.

On page 11, in Item (56), under "Other Publications", in column 1, line 35, delete "Virola" and insert -- Viirola --, therefor.

On page 11, in Item (56), under "Other Publications", in column 1, line 35, delete "fims" and insert -- films --, therefor.

On page 11, in Item (56), under "Other Publications", in column 1, line 52, delete "Existance" and insert -- Existence --, therefor.

On page 11, in Item (56), under "Other Publications", in column 1, line 61, delete "Soild" and insert -- Solid --, therefor.

On page 11, in Item (56), under "Other Publications", in column 2, line 1, delete "Dieletric" and insert -- Dielectric --, therefor.

On page 11, in Item (56), under "Other Publications", in column 2, line 4, after "thin" insert -- film --.

On page 11, in Item (56), under "Other Publications", in column 2, line 35, delete "Mircon" and insert -- Micron --, therefor.

On page 12, in Item (56), under "Other Publications", in column 1, lines 21–22, after "Cell Structure" delete "Cell Structure". (Second Occurrence)

On page 12, in Item (56), under "Other Publications", in column 1, line 30, delete "Amplifer" and insert -- Amplifier --, therefor.

On page 12, in Item (56), under "Other Publications", in column 2, line 8, delete "BicMOS" and insert -- BiCMOS --, therefor.

On page 12, in Item (56), under "Other Publications", in column 2, line 15, after "for Advanced" delete "for Advanced". (Second Occurrence)

UNITED STATES PATENT AND TRADEMARK OFFICE
CERTIFICATE OF CORRECTION

PATENT NO. : 7,160,577 B2
APPLICATION NO. : 10/137168
DATED : January 9, 2007
INVENTOR(S) : Ahn et al.

It is certified that error appears in the above-identified patent and that said Letters Patent is hereby corrected as shown below:

On page 12, in Item (56), under "Other Publications", in column 2, line 23, delete "DRAMS" and insert -- DRAMs --, therefor.

Signed and Sealed this

Twenty-second Day of May, 2007

JON W. DUDAS
*Director of the United States Patent and Trademark Office*